(12) United States Patent
Hwang

(10) Patent No.: US 11,881,260 B2
(45) Date of Patent: Jan. 23, 2024

(54) NEUROMORPHIC COMPUTING DEVICE AND METHOD OF DESIGNING THE SAME

(71) Applicant: Samsung Electronics Co., Ltd., Suwon-si (KR)

(72) Inventor: Youngnam Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 227 days.

(21) Appl. No.: 17/538,235

(22) Filed: Nov. 30, 2021

(65) Prior Publication Data

US 2022/0366976 A1 Nov. 17, 2022

(30) Foreign Application Priority Data

Apr. 29, 2021 (KR) .......................... 10-2021-0055771

(51) Int. Cl.
*G06N 3/063* (2023.01)
*G11C 13/00* (2006.01)
*G11C 7/16* (2006.01)
*G11C 11/54* (2006.01)

(52) U.S. Cl.
CPC .............. *G11C 13/004* (2013.01); *G11C 7/16* (2013.01); *G11C 11/54* (2013.01); *G11C 13/0026* (2013.01); *G11C 13/0069* (2013.01); *G11C 2013/0054* (2013.01)

(58) Field of Classification Search
CPC ......... G11C 13/004; G11C 7/16; G11C 11/54; G11C 13/0026; G11C 13/0028; G11C 13/0069; G11C 2013/0054; G11C 5/147; G11C 7/1006; G11C 13/003; G11C 2213/79; G11C 2213/82; G11C 2013/0045; G06N 3/063; G06N 5/04
See application file for complete search history.

(56) References Cited

U.S. PATENT DOCUMENTS

| 8,243,504 | B2 | 8/2012 | Kang et al. | |
|---|---|---|---|---|
| 8,954,363 | B2 * | 2/2015 | Heliot | G06N 3/065 341/120 |
| 9,412,940 | B2 * | 8/2016 | Sacchetto | G11C 13/0028 |
| 10,831,860 | B2 | 11/2020 | Kim et al. | |
| 10,832,773 | B1 | 11/2020 | Kim et al. | |

(Continued)

FOREIGN PATENT DOCUMENTS

JP  6756287 B2  9/2020
KR  10-2028476 A  10/2019

*Primary Examiner* — Hien N Nguyen
(74) *Attorney, Agent, or Firm* — Muir Patent Law, PLLC

(57) ABSTRACT

A neuromorphic computing device includes first and second memory cell arrays, and an analog-to-digital converting circuit. The first memory cell array includes a plurality of resistive memory cells, generates a plurality of read currents based on a plurality of input signals and a plurality of data, and outputs the plurality of read currents through a plurality of bitlines or source lines. The second memory cell array includes a plurality of reference resistive memory cells and an offset resistor, and outputs a reference current through a reference bitline or a reference source line. The analog-to-digital converting circuit converts the plurality of read currents into a plurality of digital signals based on the reference current. The offset resistor is connected between the reference bitline and the reference source line.

20 Claims, 26 Drawing Sheets

(56) References Cited

U.S. PATENT DOCUMENTS

| | | | |
|---|---|---|---|
| 10,878,317 B2 | 12/2020 | Hatcher et al. | |
| 10,891,222 B2 | 1/2021 | Wei | |
| 2016/0284400 A1* | 9/2016 | Yakopcic | G11C 11/54 |
| 2019/0392290 A1 | 12/2019 | Otsuka | |
| 2020/0050928 A1* | 2/2020 | Narayanan | G06N 3/065 |
| 2020/0202204 A1* | 6/2020 | Kouno | G11C 11/1673 |
| 2020/0218963 A1* | 7/2020 | Yasuda | G06N 3/048 |
| 2020/0349217 A1* | 11/2020 | Luo | G06F 9/30036 |
| 2020/0349440 A1* | 11/2020 | Gokmen | G06N 3/063 |
| 2021/0001661 A1* | 1/2021 | Hosoya | B43K 29/02 |
| 2021/0064974 A1* | 3/2021 | Kim | G06N 3/082 |

\* cited by examiner

| INPUT (x) | WEIGHT (w) | OUTPUT (x*w) | CELL CURRENT |
|---|---|---|---|
| 0 | 0 | 0 | Ioff(Rhigh) |
| 0 | 1 | 0 | Ioff(Rlow) |
| 1 | 0 | 0 | Ion(Rhigh) |
| 1 | 1 | 1 | Ion(Rlow) |

NEUROMORPHIC COMPUTING DEVICE AND METHOD OF DESIGNING THE SAME

CROSS-REFERENCE TO RELATED APPLICATION

This application claims priority under 35 USC § 119 to Korean Patent Application No. 10-2021-0055771 filed on Apr. 29, 2021 in the Korean Intellectual Property Office (KIPO), the contents of which are herein incorporated by reference in their entirety.

BACKGROUND

1. Technical Field

Example embodiments relate generally to semiconductor integrated circuits, and more particularly to neuromorphic computing devices including resistive memory cells, and methods of designing the neuromorphic computing devices.

2. Description of the Related Art

Some applications involving Deep-Learning Neural Networks (NNs) or neuromorphic computing such as image recognition, natural language processing and more generally various pattern-matching or classification tasks are quickly becoming as important as general-purpose computing. The computational element of an example NN, or neuron, multiplies of a set of input signals by a set of weights and sums the products. Thus, the neuron performs a vector-matrix product, or multiply-accumulate (MAC) operation. A NN may include a large number of interconnected neurons, each of which performs a MAC operation. Thus, operation of a NN may be computationally intensive.

A neuromorphic computing device or a neuromorphic chip is a semiconductor circuit that is manufactured by simulating, replicating or copying information processing methods using an artificial neural system at the neuron level. The neuromorphic computing devices may be used to implement intelligent systems that may adapt themselves to dynamic and/or uncertain environments.

SUMMARY

At least one example embodiment of the present disclosure provides a neuromorphic computing device capable of preventing the decrease in the accuracy of inference due to temperature and/or time dependency of resistive memory cells.

At least one example embodiment of the present disclosure provides a method of designing the neuromorphic computing device.

According to example embodiments, a neuromorphic computing device includes a first memory cell array, a second memory cell array, and an analog-to-digital converting circuit. The first memory cell array includes a plurality of resistive memory cells, stores a plurality of data, generates a plurality of read currents based on a plurality of input signals and the plurality of data, and outputs the plurality of read currents through a plurality of bitlines or a plurality of source lines. The second memory cell array includes a plurality of reference resistive memory cells and at least one offset resistor, and outputs at least one reference current through at least one reference bitline or at least one reference source line. The analog-to-digital converting circuit converts the plurality of read currents into a plurality of digital signals based on the at least one reference current. The at least one offset resistor is connected between the at least one reference bitline and the at least one reference source line.

According to example embodiments, in a method of designing a neuromorphic computing device, structures of a first memory cell array, a second memory cell array and an analog-to-digital converting circuit included in the neuromorphic computing device are designed. A resistance of at least one offset resistor included in the second memory cell array is determined. The first memory cell array includes a plurality of resistive memory cells, stores a plurality of data, generates a plurality of read currents based on a plurality of input signals and the plurality of data, and outputs the plurality of read currents through a plurality of bitlines or a plurality of source lines. The second memory cell array includes a plurality of reference resistive memory cells and the at least one offset resistor, and outputs at least one reference current through at least one reference bitline or at least one reference source line. The analog-to-digital converting circuit converts the plurality of read currents into a plurality of digital signals based on the at least one reference current. The at least one offset resistor is connected between the at least one reference bitline and the at least one reference source line.

According to example embodiments, a neuromorphic computing device includes a first memory cell array, a second memory cell array, a wordline driver, an analog-to-digital converting circuit and an adder circuit. The first memory cell array includes a plurality of resistive memory cells that are connected to a plurality of wordlines, a plurality of bitlines and a plurality of source lines. The second memory cell array includes a plurality of reference resistive memory cells and a plurality of offset resistors. The plurality of reference resistive memory cells are connected to a plurality of reference wordlines, a plurality of reference bitlines and a plurality of reference source lines. The wordline driver drives the plurality of wordlines such that such that at least one wordline among the plurality of wordlines is enabled based on element values of an input feature vector, and drives the plurality of reference wordlines such that all of the plurality of reference wordlines are enabled. The analog-to-digital converting circuit converts a plurality of read currents into a plurality of digital signals based on a plurality of reference currents. The plurality of read currents are output from the first memory cell array through the plurality of bitlines or the plurality of source lines. The plurality of reference currents are output from the second memory cell array through the plurality of reference bitlines or the plurality of reference source lines. The adder circuit generates output data by performing accumulation and summation operations based on the plurality of digital signals. Each of the plurality of offset resistors is connected between a respective one of the plurality of reference bitlines and a respective one of the plurality of reference source lines. All of the plurality of offset resistors have the same resistance. The resistances of the plurality of offset resistors are determined based on a first resistance and a second resistance, or is obtained by performing a simulation based on a plurality of sample resistances associated with the plurality of reference currents. The first resistance corresponds to a high resistance state of the plurality of reference resistive memory cells, and the second resistance corresponds to a low resistance state of the plurality of reference resistive memory cells.

In the neuromorphic computing device and the method of designing the neuromorphic computing device according to example embodiments, the plurality of read currents may be converted into the plurality of digital signals using the plurality of reference currents output from the second memory cell array that includes the same resistive material as the resistive element in the first memory cell array. Thus, the second memory cell array may have the same temperature and/or time dependency as those of the first memory cell array, and the decrease in the accuracy of inference of the neuromorphic computing device due to the temperature and/or time dependency of the plurality of resistive memory cells may be prevented. Accordingly, the reliability of the accuracy of the computation or inference of the neuromorphic computing device may be increased.

In addition, in the neuromorphic computing device and the method of designing the neuromorphic computing device according to example embodiments, the second memory cell array may include the at least one offset resistor implemented in the parallel arrangement. Thus, the offset resistors may be formed to have the same resistance for each column of the second memory cell array, and the manufacturing process may be relatively easily implemented and the maximum sensing margin may be guaranteed or ensured. Accordingly, the neuromorphic computing device may have improved or enhanced sensing performance.

BRIEF DESCRIPTION OF THE DRAWINGS

Illustrative, non-limiting example embodiments will be more clearly understood from the following detailed description taken in conjunction with the accompanying drawings.

FIGS. 6, 7, 8, 9, 10, 11, 12, 13, 14, 15 are 16 diagrams for describing operations of determining a resistance of an offset resistor included in a neuromorphic computing device according to example embodiments.

DETAILED DESCRIPTION OF THE EMBODIMENTS

Figure 1:
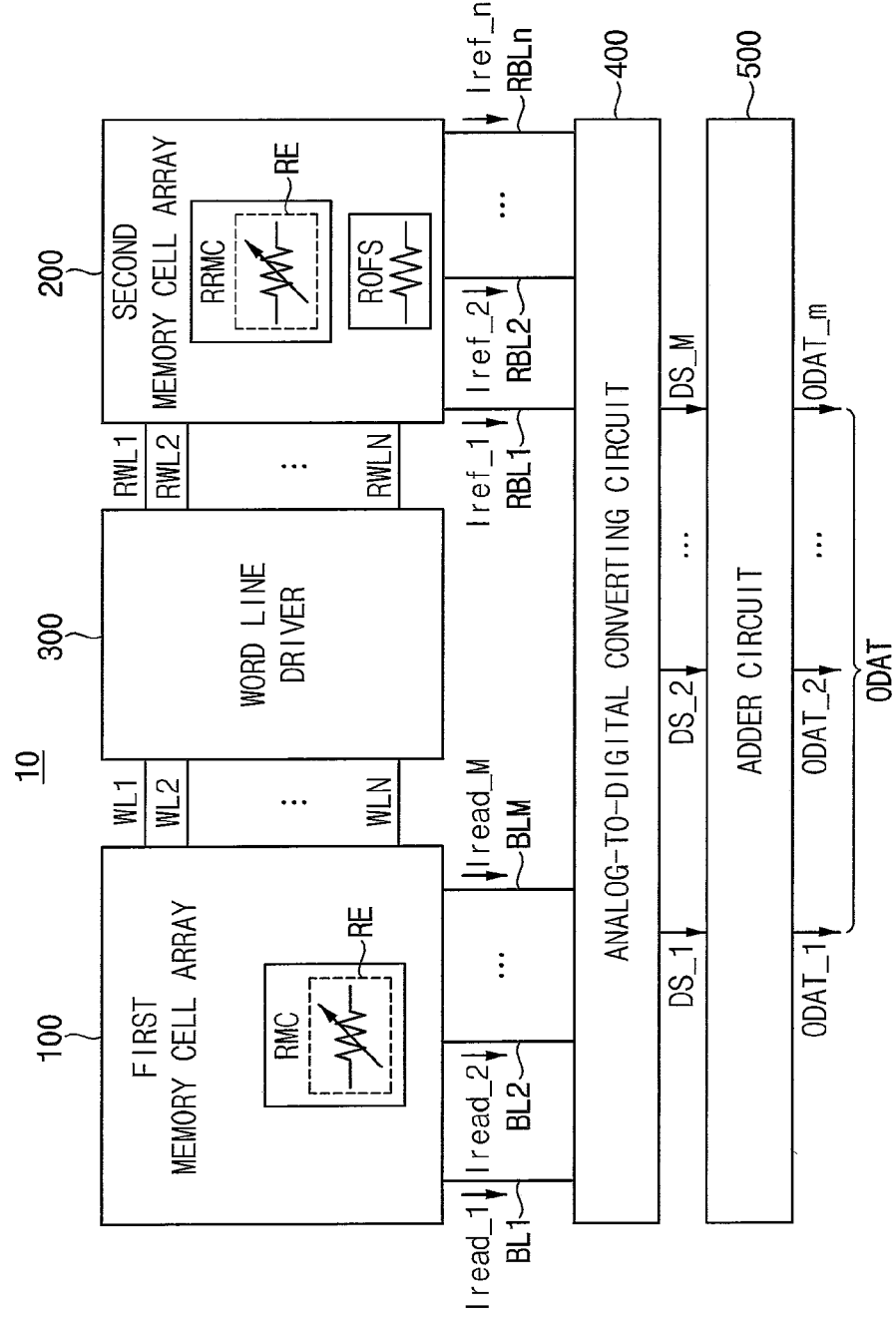
FIG. 1 is a block diagram illustrating a neuromorphic computing device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a neuromorphic computing device according to example embodiments.

Referring to FIG. 1, a neuromorphic computing device 10 includes a first memory cell array 100, a second memory cell array 200, and an analog-to-digital converting circuit 400. The neuromorphic computing device 10 may further include a wordline driver 300 and an adder circuit 500. The neuromorphic computing device 10 may be referred to as a multiplier-and-accumulator (MAC), and each of the first and second memory cell arrays 100 and 200 may be referred to as a crossbar array.

The first memory cell array 100 includes a plurality of resistive memory cells RMC that are arranged in a matrix formation. Each of the plurality of resistive memory cells RMC may include a resistive element RE. For example, each of the plurality of resistive memory cells RMC may be disposed or located in a region in which a respective one of a plurality of wordlines WL1, WL2, . . . , WLN and a respective one of a plurality of bitlines BL1, BL2, . . . , BLM intersect, where each of N and M is a natural number greater than or equal to two. For example, each of the plurality of resistive memory cells RMC may be connected to a respective one of the plurality of wordlines WL1 to WLN and a respective one of the plurality of bitlines BL1 to BLM. The first memory cell array 100 may be referred to as a main memory cell array. A detailed configuration of the first memory cell array 100 will be described with reference to FIGS. 3A and 3C.

The first memory cell array 100 stores a plurality of data. For example, the plurality of data may be stored in the plurality of resistive memory cells RMC using a change in a resistance of the resistive element RE included in each of the plurality of resistive memory cells RMC.

Under a control of the wordline driver 300, the first memory cell array 100 generates a plurality of read currents Iread_1, Iread_2, . . . , Iread_M based on a plurality of input signals that are provided through the plurality of wordlines WL1 to WLN and the plurality of data that are internally stored, and outputs the plurality of read currents Iread_1 to Iread_M through electrical paths that include the plurality of bitlines BL1 to BLM. For example, the plurality of input signals may include a plurality of input voltages and/or a plurality of input currents that are provided through the plurality of wordlines WL1 to WLN. For example, the plurality of read currents Iread_1 to Iread_M may be output through the plurality of bitlines BL1 to BLM or a plurality of source lines (e.g., SL1, SL2, . . . , SLM in FIG. 3C), and may be provided to the analog-to-digital converting circuit 400.

In some example embodiments, as will be described with reference to FIGS. 2A and 2B, the neuromorphic computing device 10 may be used to drive at least one of various neural network systems and/or machine learning systems, e.g., an artificial neural network (ANN) system, a convolutional neural network (CNN) system, a deep neural network (DNN) system, a deep learning system, or the like. Such machine learning systems may include a variety of learning models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM). Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed, or processed by the neuromorphic computing device 10.

In this example, the plurality of data stored in the first memory cell array 100 may represent a plurality of weights (e.g., a plurality of elements of a weight matrix) included in at least one layer of a neural network system, and the plurality of read currents Iread_1 to Iread_M may represent a result of multiplication and accumulation operations performed by the neural network system. For example, the first memory cell array 100 may perform a data storage operation and a computational operation (or arithmetic operation or calculation operation) at once, which will be described with reference to FIG. 3B.

The second memory cell array 200 includes a plurality of reference resistive memory cells RRMC that are arranged in a matrix formation. As with the plurality of resistive memory cells RMC, each of the plurality of reference resistive memory cells RRMC may include a resistive element RE. For example, each of the plurality of reference resistive memory cells RRMC may be disposed in a region in which a respective one of a plurality of reference wordlines RWL1, RWL2, . . . , RWLN and a respective one of a plurality of reference bitlines RBL1, RBL2, . . . , RBLn intersect, where n is a natural number greater than or equal to two. For example, each of the plurality of reference resistive memory cells RRMC may be connected to a respective one of the plurality of reference wordlines RWL1 to RWLN and a respective one of the plurality of reference bitlines RBL1 to RBLn. The second memory cell array 200 may be referred to as a reference memory cell array. A detailed configuration of the second memory cell array 200 will be described with reference to FIG. 4.

Under a control of the wordline driver 300, the second memory cell array 200 generates a plurality of reference currents Iref_1, Iref_2, . . . , Iref_n, and outputs the plurality of reference currents Iref_1 to Iref_n through electrical paths that include the plurality of reference bitlines RBL1 to RBLn. For example, the plurality of reference currents Iref_1 to Iref_n may be output through the plurality of reference bitlines RBL1 to RBLn or a plurality of reference source lines (e.g., RSL1, RSL2, . . . , RSLn in FIG. 4), and may be provided to the analog-to-digital converting circuit 400.

In addition, the second memory cell array 200 includes at least one offset resistor ROFS. The at least one offset resistor ROFS is implemented in a parallel arrangement. For example, each offset resistor ROFS may be connected between one reference bitline (e.g., RBL1) and one reference source line (e.g., RSL1) corresponding to the one reference bitline. One offset resistor is not necessarily connected only with one reference bitline or one reference source line, and may be connected between a pair of signal lines including one reference bitline and one reference source line. The number of the offset resistors ROFS may be substantially equal to the number of the reference bitlines RBL1 to RBLn and the number of the reference source lines RSL1 to RSLn.

In some example embodiments, the plurality of reference resistive memory cells RRMC in the second memory cell array 200 may include the same resistive material as a resistive material included in the plurality of resistive memory cells RMC in the first memory cell array 100. For example, the resistive element RE in each of the resistive memory cells RMC and the resistive element RE in each of the reference resistive memory cells RRMC may include or be formed of the same resistive material.

In some example embodiments, the number of the reference bitlines RBL1 to RBLn connected to the second memory cell array 200 (e.g., the number of the reference currents Iref_1 to Iref_n) may be equal to the number of the wordlines WL1 to WLN and the number of the reference wordlines RWL1 to RWLN. For example, N=n, however, example embodiments are not limited thereto.

In some example embodiments, the number of the reference bitlines RBL1 to RBLn connected to the second memory cell array 200 may be determined based on the number of bits of digital signals (e.g., DS_1, DS_2, . . . , DS_M) to be described later. For example, when the number of bits of each digital signal is k, where k is a natural number, the number of the reference bitlines RBL1 to RBLn connected to the second memory cell array 200 may correspond to a number obtained by subtracting one from $2^k$. For example, when each of the digital signals DS_1 to DS_M is a 2-bit digital signal, a 4-bit digital signal and a 5-bit digital signal, the second memory cell array 200 may be connected to three reference bitlines, fifteen reference bitlines and thirty one reference bitlines. Alternatively, when each of the digital signals DS_1 to DS_M is a 1-bit digital signal, the second memory cell array 200 may be connected to one reference bitline, unlike that illustrated in FIG. 1.

The wordline driver 300 may drive the plurality of wordlines WL1 to WLN connected to the first memory cell array 100, and may drive the plurality of reference wordlines RWL1 to RWLN connected to the second memory cell array 200.

For example, during the computational operation of the neuromorphic computing device 10, the wordline driver 300 may drive the plurality of wordlines WL1 to WLN such that at least one wordline selected from among the plurality of wordlines WL1 to WLN is enabled or activated based on element values of an input feature vector. For example, when each of the element values of the input feature vector whose length is N has a value of '1' or '0', the wordline driver 300 may drive the plurality of wordlines WL1 to WLN such that a wordline corresponding to a position of an element having a value of '1' is enabled.

For example, during the computational operation of the neuromorphic computing device 10, the wordline driver 300 may drive the plurality of reference wordlines RWL1 to RWLN such that all of the plurality of reference wordlines RWL1 to RWLN are enabled or activated.

The analog-to-digital converting circuit 400 converts the plurality of read currents Iread_1 to Iread_M into a plurality of digital signals DS_1, DS_2, ..., DS_M based on the plurality of reference currents Iref_1 to Iref_n, and outputs the plurality of digital signals DS_1 to DS_M. For example, the analog-to-digital converting circuit 400 may convert the plurality of read currents Iread_1 to Iread_M into the plurality of digital signals DS_1 to DS_M using the plurality of reference currents Iref_1 to Iref_n as a reference for analog-to-digital conversion. For example, the analog-to-digital converting circuit 400 may include a plurality of analog-to-digital converters. In some example embodiments, the number of the analog-to-digital converters may be equal to the number of the read currents Iread_1 to Iread_M. In other example embodiments, the number of the analog-to-digital converters may be less than the number of the read currents Iread_1 to Iread_M. A detailed configuration of the analog-to-digital converting circuit 400 will be described with reference to FIGS. 19A and 19C. The analog-to-digital converting circuit 400 may provide the plurality of digital signals DS_1 to DS_M to the adder circuit 500.

In some example embodiments, although not illustrated in detail, the neuromorphic computing device 10 may further include a current-to-voltage converting circuit that is disposed or located between the first and second memory cell arrays 100 and 200 and the analog-to-digital converting circuit 400. The current-to-voltage converting circuit may convert the plurality of read currents Iread_1 to Iread_M and the plurality of reference currents Iref_1 to Iref_n into a plurality of signal voltages and a plurality of reference voltages, respectively. In this example, the analog-to-digital converting circuit 400 may perform the analog-to-digital conversion based on the plurality of signal voltages and the plurality of reference voltages.

The adder circuit 500 may generate output data ODAT by performing accumulation and summation operations based on the plurality of digital signals DS_1 to DS_M. For example, the adder circuit 500 may generate a plurality of output data ODAT_1, ODAT_2, ..., ODAT_m based on the plurality of digital signals DS_1 to DS_M, where m is a natural number greater than or equal to two. For example, M=m, however, example embodiments are not limited thereto. In some example embodiments, the adder circuit 500 may include at least one adder and at least one shift register.

Typically, the plurality of resistive memory cells RMC included in the first memory cell array 100 have temperature and time dependency. For example, the resistive element RE included in each of the plurality of resistive memory cells RMC may have a temperature dependency in which a resistance decreases as a temperature increases and the resistance increases as the temperature decreases. In addition, the resistive element RE may have a time dependency including a retention characteristic in which the resistance decreases as time goes on, a drift characteristic in which the resistance increases when a span of time (e.g., a predetermined, suitable, and/or advantageous span of time) elapses after a data write operation, or the like. Thus, the read currents Iread_1 to Iread_M output from the first memory cell array 100 may be changed depending on temperature and time. To store accurate data and perform computation or calculation without errors, it is important to reduce or eliminate such temperature and time dependency.

In the neuromorphic computing device 10 according to example embodiments, the plurality of read currents Iread_1 to Iread_M may be converted into the plurality of digital signals DS_1 to DS_M using the plurality of reference currents Iref_1 to Iref_n output from the second memory cell array 200 that includes the same resistive material as the resistive element RE in the first memory cell array 100. Thus, the second memory cell array 200 may have the same temperature and/or time dependency as those of the first memory cell array 100, and the decrease in the accuracy of inference of the neuromorphic computing device 10 due to the temperature and/or time dependency of the plurality of resistive memory cells RMC may be prevented. Accordingly, the reliability of the accuracy of the computation or inference of the neuromorphic computing device 10 may be increased.

In addition, in the neuromorphic computing device 10 according to example embodiments, the second memory cell array 200 may include the at least one offset resistor ROFS implemented in the parallel arrangement. Thus, the offset resistors ROFS may be formed to have the same resistance for each column of the second memory cell array 200, and the manufacturing process may be relatively easily implemented and the maximum sensing margin may be guaranteed or ensured. Accordingly, the neuromorphic computing device 10 may have improved or enhanced sensing performance.

Figure 2A:
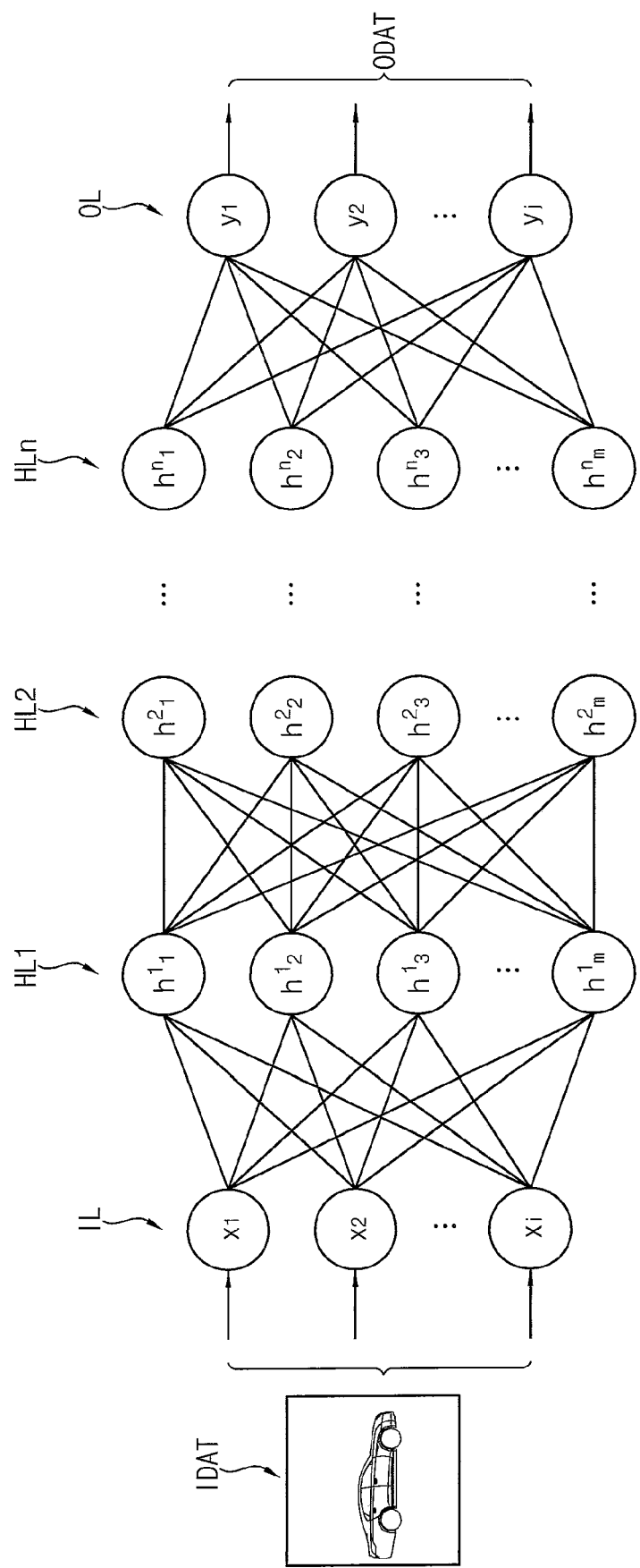
FIGS. 2A and 2B are diagrams for describing examples of a neural network system that is driven by a neuromorphic computing device according to example embodiments.
Figure 2B:
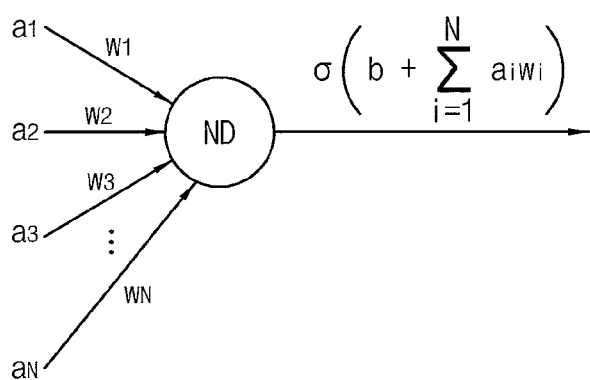

FIGS. 2A and 2B are diagrams for describing examples of a neural network system that is driven by a neuromorphic computing device according to example embodiments.

Referring to FIG. 2A, a general neural network may include an input layer IL, a plurality of hidden layers HL1, HL2, ..., HLn and an output layer OL.

The input layer IL may include i input nodes $x_1$, $x_2$, ..., $x_i$, where i is a natural number. Input data (e.g., vector input data) IDAT whose length is i may be input to the input nodes $x_1$, $x_2$, ..., $x_i$ such that each element of the input data IDAT is input to a respective one of the input nodes $x_1$, $x_2$, ..., $x_i$.

The plurality of hidden layers HL1, HL2, ..., HLn may include n hidden layers, where n is a natural number, and may include a plurality of hidden nodes $h^1_1$, $h^1_2$, $h^1_3$, ..., $h^1_m$, $h^2_1$, $h^2_2$, $h^2_3$, ..., $h^2_m$, $h^n_1$, $h^n_2$, $h^n_3$, ..., $h^n_m$. For example, the hidden layer HL1 may include m hidden nodes $h^1_1$, $h^1_2$, $h^1_3$, ..., $h^1_m$, the hidden layer HL2 may include m hidden nodes $h^2_1$, $h^2_2$, $h^2_3$, ..., $h^2_m$, and the hidden layer HLn may include m hidden nodes $h^n_1$, $h^n_2$, $h^n_3$, ..., $h^n_m$, where m is a natural number.

The output layer OL may include j output nodes $y_1$, $y_2$, ..., $y_j$, where j is a natural number. Each of the output nodes $y_1$, $y_2$, ..., $y_j$ may correspond to a respective one of classes to be categorized. The output layer OL may generate output values (e.g., class scores or numerical output such as a regression variable) and/or output data ODAT associated with the input data IDAT for each of the classes. In some example embodiments, the output layer OL may be a fully-connected layer and may represent, for example, a probability that the input data IDAT corresponds to a car.

A structure of the neural network illustrated in FIG. 2A may be represented by information on branches (or connections) between nodes illustrated as lines, and a weighted value assigned to each branch, which is not illustrated. In some neural network models, nodes within one layer may not be connected to one another, but nodes of different layers may be fully or partially connected to one another. In some other neural network models, such as unrestricted Boltzmann machines, at least some nodes within one layer may also be connected to other nodes within one layer in addition to (or alternatively with) one or more nodes of other layers.

Each node (e.g., the node $h^1_1$) may receive an output of a previous node (e.g., the node $x_1$), may perform a computing operation, computation or calculation on the received output, and may output a result of the computing operation, computation or calculation as an output to a next node (e.g., the node $h^2_1$). Each node may calculate a value to be output by applying the input to a specific function, e.g., a nonlinear function.

In some example embodiments, the structure of the neural network is set in advance, and the weighted values for the connections between the nodes are set appropriately using data having an already known answer of which class the data belongs to (sometimes referred to as a "label"). The data with the already known answer is sometimes referred to as "training data", and a process of determining the weighted value is sometimes referred to as "training". The neural network "learns" to associate the data with corresponding labels during the training process. A group of an independently trainable structure and the weighted value is sometimes referred to as a "model", and a process of predicting, by the model with the determined weighted value, which class the input data belongs to, and then outputting the predicted value, is sometimes referred to as a "testing" process.

Referring to FIG. 2B, an example of an operation performed by one node ND included in the neural network of FIG. 2A is illustrated in detail.

Based on N inputs $a_1, a_2, a_3, \ldots, a_N$ provided to the node ND, the node ND may multiply the N inputs $a_1$ to $a_N$ and corresponding N weights $w_1, w_2, w_3, w_N$, respectively, may sum N values obtained by the multiplication, may add an offset "b" to a summed value, and may generate one output value (e.g., "z") by applying a value to which the offset "b" is added to a specific function "σ".

In some example embodiments and as illustrated in FIG. 2B, one layer included in the neural network illustrated in FIG. 2A includes M nodes ND, and output values of the one layer may be obtained by Equation 1.

$$W*A=Z \quad \text{[Equation 1]}$$

In Equation 1, "W" denotes weights for all connections included in the one layer, and may be implemented in an M*N matrix form. "A" denotes the N inputs $a_1$ to $a_N$ received by the one layer, and may be implemented in an N*1 matrix form. "Z" denotes M outputs $z_1, z_2, z_3, \ldots, z_M$ output from the one layer, and may be implemented in an M*1 matrix form. The inputs $a_1$ to $a_N$ may be expressed as "x", e.g., $x_1, x_2, x_3, \ldots, x_N$, and the outputs $z_1$ to $z_M$ may be expressed as "y", e.g., $y_1, y_2, y_3, \ldots, y_M$.

Figure 3A:
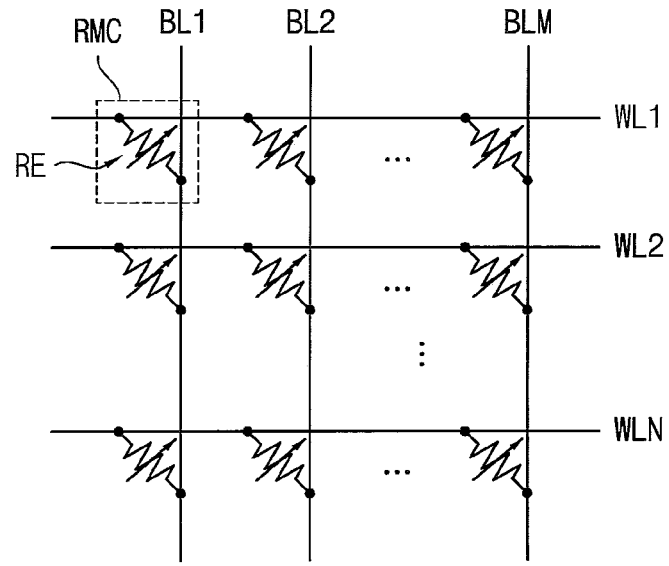
FIGS. 3A, 3B and 3C are diagrams illustrating examples of a first memory cell array included in a neuromorphic computing device according to example embodiments.
Figure 3B:
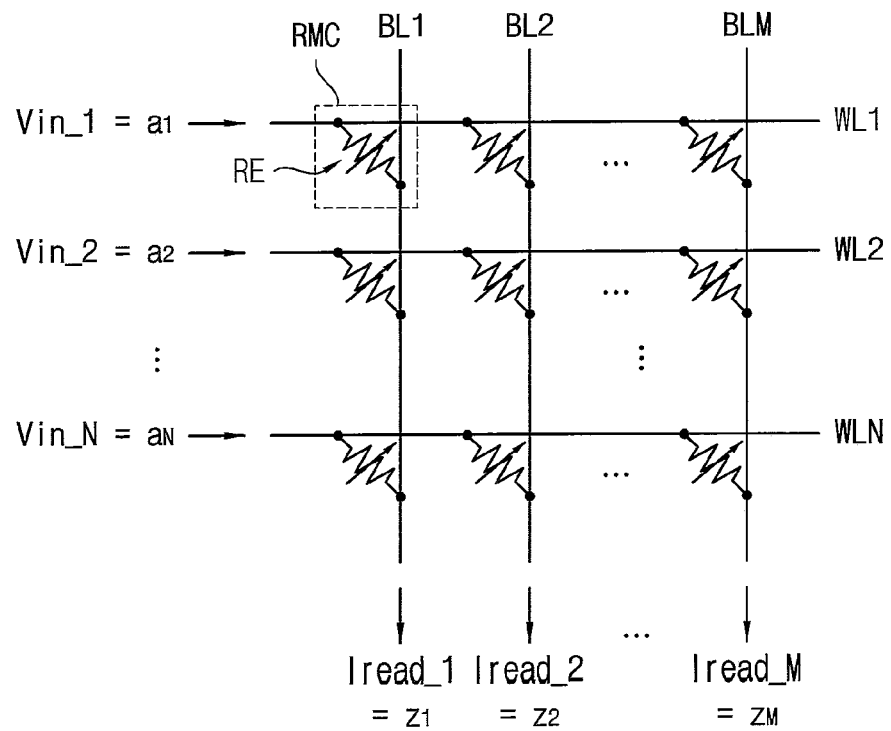
Figure 3C:
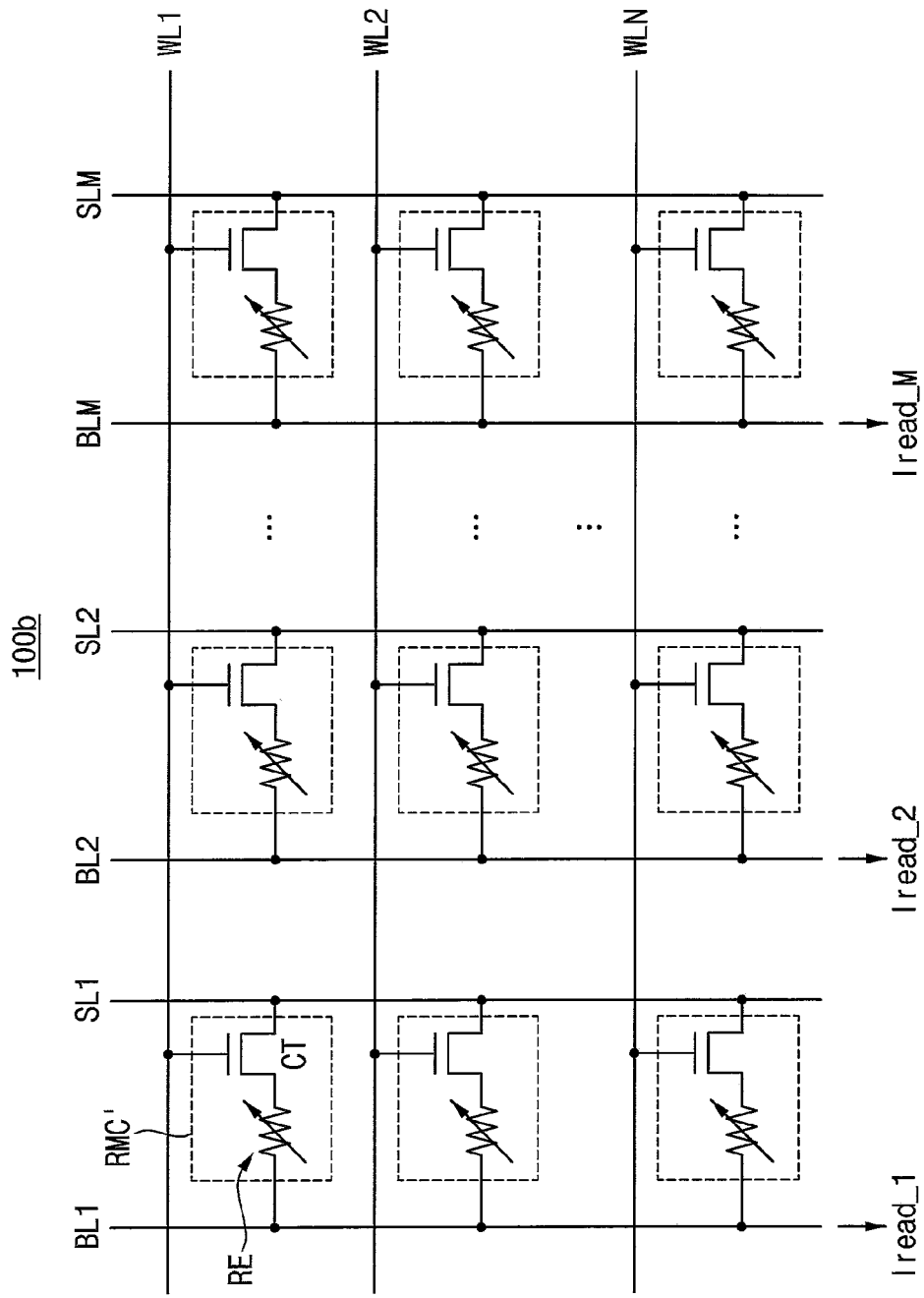

FIGS. 3A, 3B and 3C are diagrams illustrating examples of a first memory cell array included in a neuromorphic computing device according to example embodiments.

Referring to FIG. 3A, a first memory cell array 100a may include a plurality of resistive memory cells RMC disposed in regions where a plurality of wordlines WL1, WL2, ..., WLN and a plurality of bitlines BL1, BL2, ..., BLM intersect. For example, the plurality of wordlines WL1 to WLN may correspond to a plurality of rows, and the plurality of bitlines BL1 to BLM may correspond to a plurality of columns. Each of the plurality of resistive memory cells RMC may include a resistive element RE, and may be connected to a respective one of the plurality of wordlines WL1 to WLN and a respective one of the plurality of bitlines BL1 to BLM.

A resistance of the resistive element RE may be changed based on voltages applied through the plurality of wordlines WL1 to WLN and/or the plurality of bitlines BL1 to BLM, and the plurality of resistive memory cells RMC may store a plurality of data by the change in the resistance of the resistive element RE. For example, based on a write voltage being applied to a selected wordline and a ground voltage (e.g., about 0V) being applied to a selected bitline, the device may write data '1' into a selected resistive memory cell. Based on the ground voltage being applied to the selected wordline and the write voltage being applied to the selected bitline, the device may write data '0' into the selected resistive memory cell. Further, based on a read voltage being applied to the selected wordline and the ground voltage being applied to the selected bitline, the device may read or retrieve data written in the selected resistive memory cell.

In some example embodiments, each of the plurality of resistive memory cells RMC may include one of various resistive memory cells, e.g., a phase change random access memory (PRAM) cell, a resistance random access memory (RRAM) cell, a magnetic random access memory (MRAM) cell, a ferroelectric random access memory (FRAM) cell, or the like.

In some example embodiments, the resistive element RE may include or may be formed of a phase change material that changes its crystalline state depending on an amount of a current. The phase change material may include one of various materials such as GaSb, InSb, InSe, Sb2Te3, and GeTe in which two elements are combined, GeSbTe, GaSeTe, InSbTe, SnSb2Te4, and InSbGe in which three elements are combined, and AgInSbTe, (GeSn)SbTe, GeSb(SeTe), and Te81Ge15Sb2S2 in which four elements are combined. In other example embodiments, the resistive element RE may include or may be formed of a perovskite compound, a transition metal oxide, a magnetic material, a ferromagnetic material, or an anti-ferromagnetic material, instead of the phase change material. However, the materials included in the resistive element RE are not limited thereto.

Referring to FIG. 3B, an example in which the first memory cell array 100a of FIG. 3A performs the operation described with reference to FIGS. 2A and 2B is illustrated.

Each resistive memory cell RMC may correspond to one synapse or connection in the neural network system, and may store one weight. Thus, M*N data stored in the first memory cell array 100a may correspond to a weight matrix that includes the weights included in the one layer described with reference to FIGS. 2A and 2B. The M*N data may correspond to "W" that is implemented in the M*N matrix form in Equation 1.

N input voltages (or read voltages) Vin_1, Vin_2, ..., Vin_N applied through the plurality of wordlines WL1 to WLN may correspond to an input matrix that includes the N inputs $a_1$ to $a_N$ received by the one layer described with reference to FIGS. 2A and 2B. The N input voltages Vin_1 to Vin_N may correspond to "A" that is implemented in the N*1 matrix form in Equation 1.

M read currents Iread_1, Iread_2, ..., Iread_M output through the plurality of bitlines BL1 to BLM may correspond to an output matrix that includes the M outputs $z_1$ to $z_M$ output from the one layer described with reference to FIGS. 2A and 2B. The M read currents Iread_1 to Iread_M may correspond to "Z" that is implemented in the M*1 matrix form in Equation 1.

Based on the first memory cell array 100a being implemented by storing the plurality of weights having a matrix form in the plurality of resistive memory cells RMC, and based on the input voltages Vin_1 to Vin_N corresponding to the plurality of inputs being provided through the plurality of wordlines WL1 to WLN, the device may generate the read currents Iread_1 to Iread_M output through the plurality of bitlines BL1 to BLM that correspond to the result of the multiplication and accumulation operations performed by the neural network system. By implementing the at least one layer in the neural network system in this manner, the neuromorphic computing device may perform the data storage and computational operations at once.

Referring to FIG. 3C, a first memory cell array 100b may include a plurality of resistive memory cells RMC' disposed in regions where a plurality of wordlines WL1, WL2, WLN intersect a plurality of bitlines BL1, BL2, BLM and a plurality of source lines SL1, SL2, SLM. The descriptions repeated with FIG. 3A will be omitted.

Each of the plurality of resistive memory cells RMC' may include a cell transistor CT and a resistive element RE, and may be connected to a respective one of the plurality of wordlines WL1 to WLN, a respective one of the plurality of bitlines BL1 to BLN and a respective one of the plurality of source lines SL1 to SLM. For example, the cell transistor CT may include a first electrode (such as a drain, source, collector, or emitter) connected to one of the plurality of source lines SL1 to SLM, a second electrode (such as a source, drain, or emitter, which may be an opposite of the first electrode), and a third electrode (such as a gate electrode or a base electrode) connected to one of the plurality of wordlines WL1 to WLN. The resistive element RE may be connected between the second electrode of the cell transistor CT and one of the plurality of bitlines BL1 to BLN.

For example, based on a power supply voltage (e.g., VCC) being applied to a selected wordline, a write voltage being applied to a selected bitline, and a ground voltage being applied to a selected source line, the device may write data '1' into a selected resistive memory cell. Based on the power supply voltage being applied to the selected wordline, the ground voltage being applied to the selected bitline, the write voltage being applied to the selected source line, the device may write data '0' into the selected resistive memory cell. Further, based on the power supply voltage being applied to the selected wordline, a read voltage being applied to the selected bitline, and the ground voltage being applied to the selected source line, the device may read or retrieve data written in the selected resistive memory cell.

As with that described with reference to FIG. 3B, the first memory cell array 100b may output a plurality of read currents Iread_1, Iread_2, . . . , Iread_M. Although FIG. 3C illustrates that the plurality of read currents Iread_1 to Iread_M are output through the plurality of bitlines BL1 to BLN, example embodiments are not limited thereto. For example, the plurality of read currents Iread_1 to Iread_M may be output through the plurality of source lines SL1 to SLM.

Although FIGS. 3A, 3B and 3C illustrate that the first memory cell arrays 100a and 100b have a two-dimensional (2D) array structure, example embodiments are not limited thereto. For example, a first memory cell array may be formed in a three-dimensional (3D) or vertical array structure. In addition, a configuration of the resistive memory cells RMC and RMC' may be changed according to example embodiments.

Figure 4:
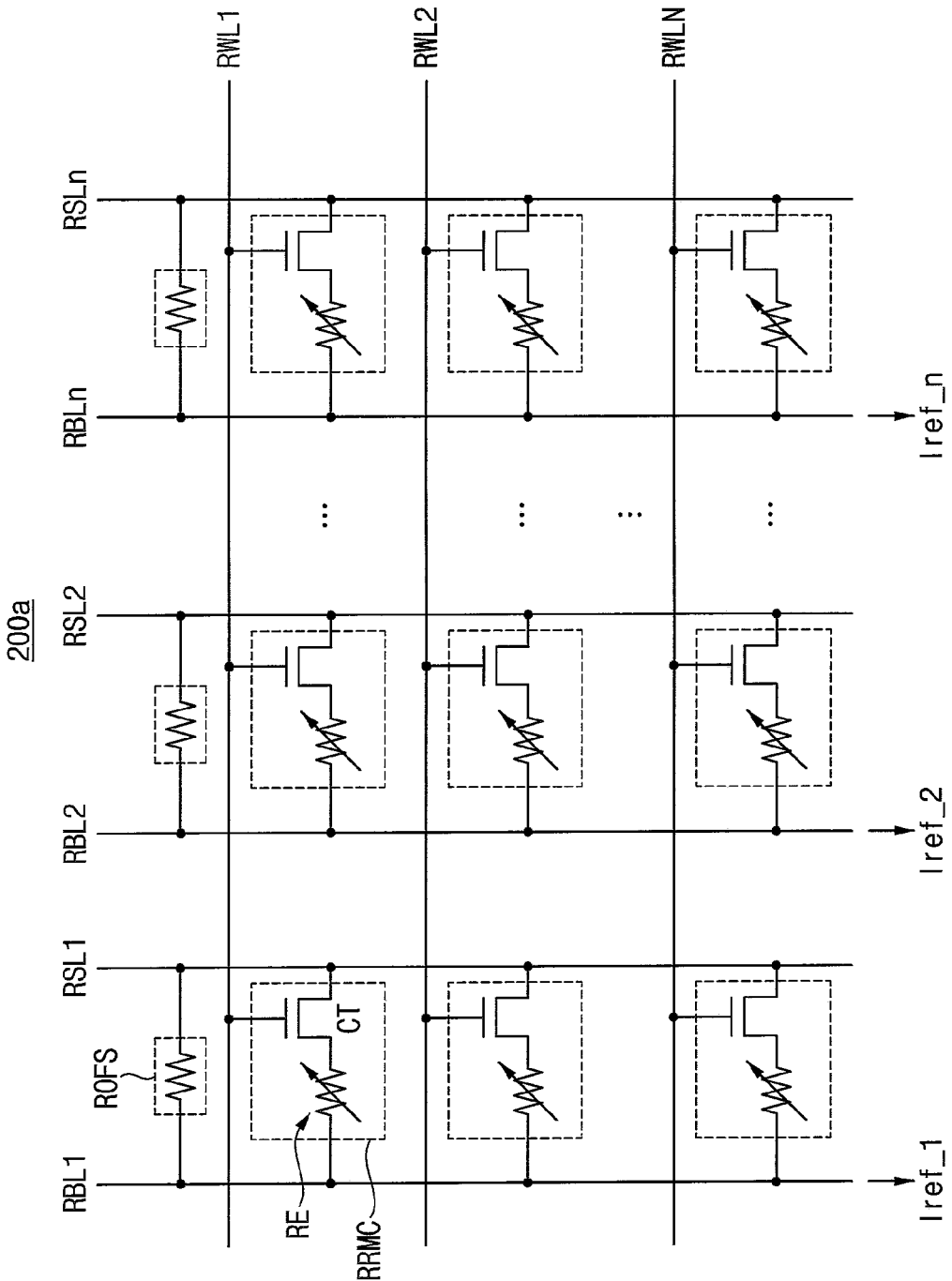
FIG. 4 is a diagram illustrating an example of a second memory cell array included in a neuromorphic computing device according to example embodiments.

FIG. 4 is a diagram illustrating an example of a second memory cell array included in a neuromorphic computing device according to example embodiments.

Referring to FIG. 4, a second memory cell array 200a may include a plurality of reference resistive memory cells RRMC disposed in regions where a plurality of reference wordlines RWL1, RWL2, . . . , RWLN intersect a plurality of reference bitlines RBL1, RBL2, . . . , RBLn and a plurality of reference source lines RSL1, RSL2, . . . , RSLn, and may include a plurality of offset resistors ROFS. The second memory cell array 200a may have a configuration similar to that of the first memory cell array 100b of FIG. 3C. The descriptions repeated with FIG. 3C will be omitted.

Each of the plurality of reference resistive memory cells RRMC may include a cell transistor CT and a resistive element RE, and may be connected to a respective one of the plurality of reference wordlines RWL1 to RWLN, a respective one of the plurality of reference bitlines RBL1 to RBLn and a respective one of the plurality of reference source lines RSL1 to RSLn. For example, the cell transistor CT may include a first electrode connected to one of the plurality of reference source lines RSL1 to RSLn, a second electrode, and a third electrode connected to one of the plurality of reference wordlines RWL1 to RWLN. The resistive element RE may be connected between the second electrode of the cell transistor CT and one of the plurality of reference bitlines RBL1 to RBLn.

Each of the plurality of offset resistors ROFS may be connected between a respective one of the plurality of reference bitlines RBL1 to RBLn and a respective one of the plurality of reference source lines RSL1 to RSLn. For example, the plurality of offset resistors ROFS may include a first offset resistor connected between the first reference bitline RBL1 and the first reference source line RSL1, a second offset resistor connected between the second reference bitline RBL2 and the second reference source line RSL2, and an n-th offset resistor connected between the n-th reference bitline RBLn and the n-th reference source line RSLn.

In some example embodiments, all of the plurality of offset resistors ROFS may have substantially the same resistance, and thus the manufacturing process may be relatively easily implemented and the maximum sensing margin may be guaranteed or ensured. Detailed processes or operations of determining the resistances of the plurality of offset resistors ROFS will be described with reference to FIGS. 6 through 16.

The second memory cell array 200a may output a plurality of reference currents Iref_1, Iref_2, . . . , Iref_n. Although FIG. 4 illustrates that the plurality of reference currents Iref_1 to Iref_n are output through the plurality of reference bitlines RBL1 to RBLn, example embodiments are not limited thereto. For example, the plurality of reference currents Iref_1 to Iref_n may be output through the plurality of reference source lines RSL1 to RSLn.

In some example embodiments, when the second memory cell array is implemented as illustrated in FIG. 4, the first memory cell array may be implemented as illustrated in FIG. 3C.

Figure 5:
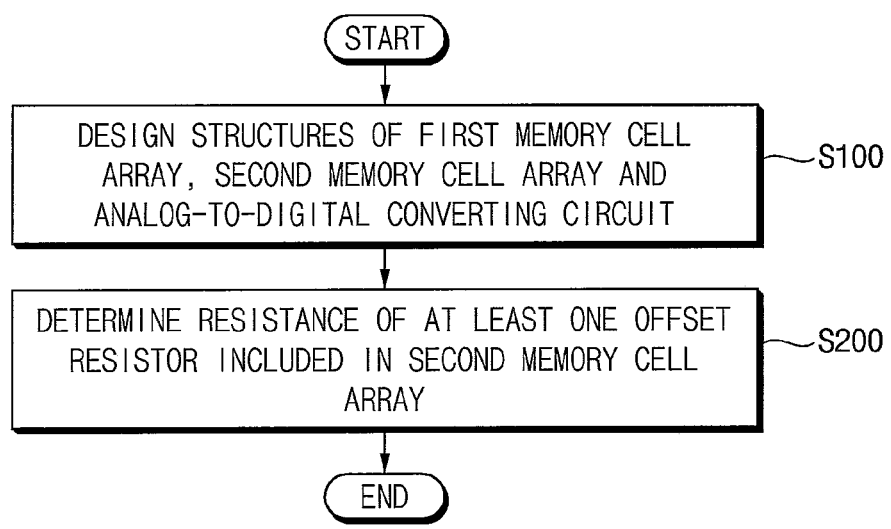
FIG. 5 is a flowchart illustrating a method of designing a neuromorphic computing device according to example embodiments.

FIG. 5 is a flowchart illustrating a method of designing a neuromorphic computing device according to example embodiments.

Referring to FIGS. 1 and 5, in a method of designing a neuromorphic computing device according to example embodiments, structures of the first memory cell array 100, the second memory cell array 200, and the analog-to-digital converting circuit 400 included in the neuromorphic computing device 10 are designed (step S100). For example, the structures (e.g., circuit structures) may represent a design layout, may include a plurality of circuit patterns, layout patterns, and/or corresponding polygons, and may be provided by at least one of various design tools. For example, the neuromorphic computing device 10 may further include the wordline driver 300 and the adder circuit 500, and structures of the wordline driver 300 and the adder circuit 500 may be further designed in step S100.

The resistance of the at least one offset resistor ROFS included in the second memory cell array 200 is determined (step S200). For example, the second memory cell array 200 may be implemented as described with reference to FIG. 4, and the at least one offset resistor ROFS may be implemented in the parallel arrangement.

In some example embodiments, a method of manufacturing a neuromorphic computing device according to example embodiments may be performed using the method of designing the neuromorphic computing device of FIG. 5.

FIGS. 6, 7, 8, 9, 10, 11, 12, 13, 14, 15 are 16 diagrams for describing operations of determining a resistance of an offset resistor included in a neuromorphic computing device according to example embodiments.

Figure 6:
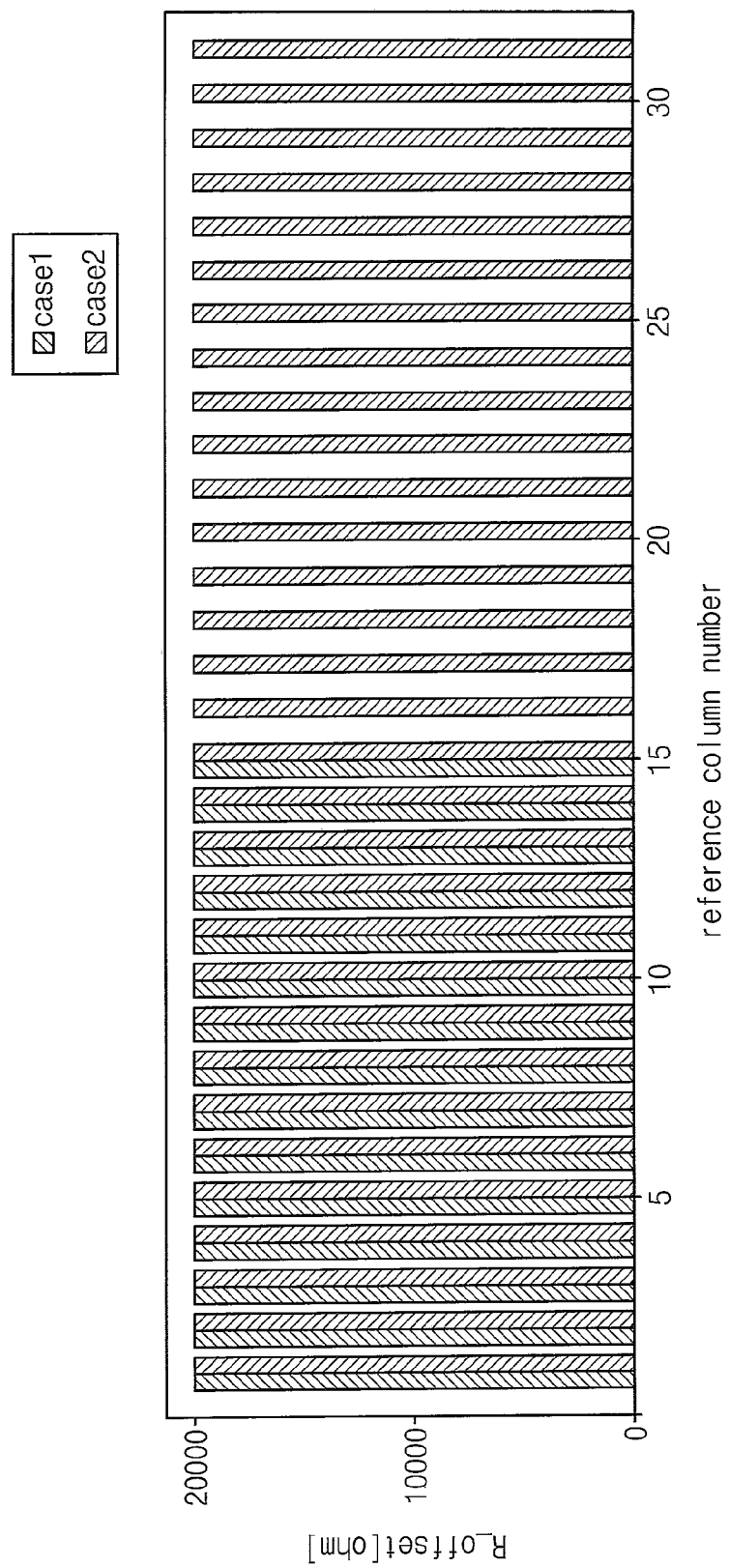

Referring to FIG. 6, an example in which the resistances of the plurality of offset resistors ROFS are determined is illustrated.

In some example embodiments, the resistance of the offset resistor ROFS illustrated in FIG. 6 may be determined based on a first resistance and a second resistance. The first resistance may correspond to a high resistance state of the reference resistive memory cell RRMC (or of the resistive element RE), and the second resistance may correspond to a low resistance state of the reference resistive memory cell RRMC (or of the resistive element RE). For example, the first resistance may represent a resistance of the reference resistive memory cell RRMC in which data '0' is written, and the second resistance may represent a resistance of the reference resistive memory cell RRMC in which data '1' is written. For example, the resistance of the offset resistor ROFS may be obtained based on Equation 2, Equation 3 and Equation 4.

$$I_{REF}(mac) = \frac{I(mac+1) + I(mac)}{2} \quad \text{[Equation 2]}$$

$$\frac{n - mac}{Rh} + \frac{mac}{Rl} + \frac{1}{Roffset} = \frac{n - mac}{Rh} + \frac{mac}{Rl} + \frac{Rh - Rl}{2RhRl} \quad \text{[Equation 3]}$$

$$Roffset = \frac{2RhRl}{Rh - Rl} \quad \text{[Equation 4]}$$

In Equation 2, Equation 3 and Equation 4, "n" denotes the number of the reference bitlines RBL1 to RBLn, "mac" denotes an integer greater than or equal to zero and less than or equal to n, "I(mac)" and "I(mac+1)" are two current levels adjacent to each other among current levels that each of the read currents Iread_1 to Iread_M may have, and "$I_{REF}$ (mac)" denotes a reference current level of a reference current used to distinguish between I(mac) and I(mac+1) among the reference currents Iref_1 to Iref_n. As represented by Equation 2, $I_{REF}$(mac) may be located or positioned between I(mac) and I(mac+1). In addition, "Roffset" denotes the resistance of the at least one offset resistor, "Rh" denotes the first resistance, and "Rl" denotes the second resistance.

For example, when N=n in FIG. 1 and the plurality of wordlines WL1 to WLN include first to n-th wordlines, each of the read currents Iread_1 to Iread_M may have one of first to (n+1)-th current levels based on data stored in the plurality of resistive memory cells RMC. For example, resistive memory cells connected to one bitline may form one column, and a current level of one read current may be determined based on data stored in the resistive memory cells connected to one column. For example, the first current level may be the lowest current level and the read current having the first current level may be obtained when data '0' is written to all of the resistive memory cells connected to one column. For example, the (n+1)-th current level may be the highest current level and the read current having the (n+1)-th current level may be obtained when data '1' is written to all of the resistive memory cells connected to one column. The first to (n+1)-th current levels may be referred to as MAC current values or simply MAC values. Each of the reference currents Iref_1 to Iref_n may be used to distinguish two adjacent current levels of the read current. For example, the first reference current Iref_1 may have a first reference current level between the first and second current levels (or MAC current values), and the n-th reference current Iref_n may have an n-th reference current level between the n-th and (n+1)-th current levels (or MAC current values).

As illustrated in FIG. 6, the resistances of all of the plurality of offset resistors ROFS may be determined to have substantially the same resistance based on Equation 4.

In a graph of FIG. 6, a vertical axis represents the resistances of the plurality of offset resistors ROFS, a horizontal axis represents the number of reference columns and/or the number of the wordlines, "case1" represents an example in which the number of the reference columns (e.g., the number of the reference bitlines and the reference columns) is fifteen, and "case2" represents an example in which the number of the reference columns is thirty one. For example, one column formed by one reference bitline and one reference source line may be defined as one reference column. One offset resistor may be disposed in and/or connected to each reference column.

In an example of FIG. 6, the resistances of the plurality of offset resistors ROFS may be determined by writing the reference resistive memory cells RRMC at a temperature of about 300K (e.g., about 27 degrees Celsius) and by measuring the first and second resistances of the reference resistive memory cells RRMC about 1 second after the writing. For example, the resistances of the plurality of offset resistors ROFS may be equally determined to be about 20050Ω for all reference columns.

A neuromorphic computing device (e.g., an analog MAC) including resistive elements may operate by sensing currents (e.g., read currents), and reference currents may be used for sensing the currents. When offset resistors are implemented in a series arrangement (e.g., when an offset resistor is connected between a reference source line and a ground voltage), all resistive elements connected to the same bitline may be affected. In contrast, when the offset resistors are implemented in the parallel arrangement (e.g., when the offset resistor is connected between the reference bitline and the reference source line) according to example embodiments, constant currents may be generated without affecting other resistive elements. For example, as illustrated in FIG. 6, the resistances of the offset resistors may be determined to be the same value regardless of positions and/or the number of the reference columns.

Figure 7:
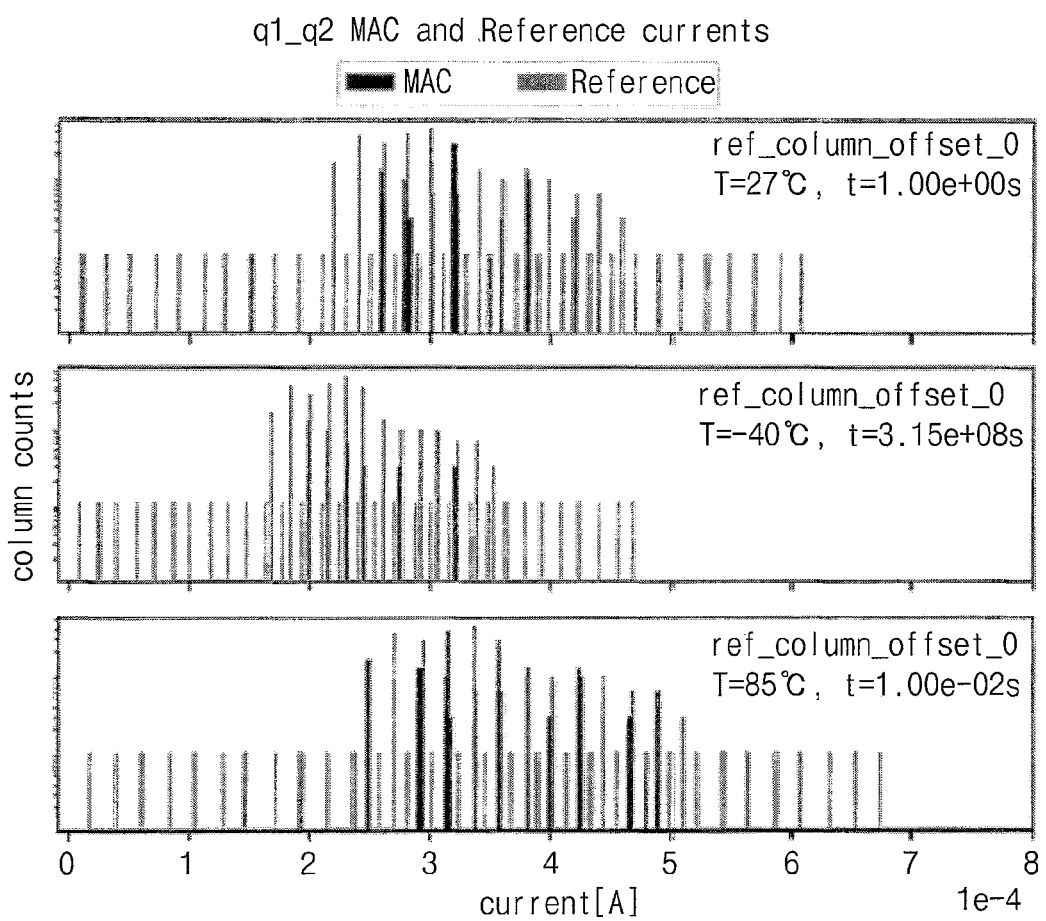

Referring to FIG. 7, changes in current levels of the read current and the reference current depending on changes in temperature and time are illustrated when the offset resistors ROFS are implemented in the parallel arrangement according to example embodiments and when the resistances of the plurality of offset resistors ROFS are determined as described with reference to FIG. 6 and Equation 4.

In a graph of FIG. 7, a vertical axis represents the number of measurements, a horizontal axis represents a current level, "MAC" represents the read current, and "Reference"

represents the reference current. An upper graph illustrates the current levels of the read current and the reference current in a first condition in which the resistive memory cells RMC and the reference resistive memory cells RRMC are written at a temperature of about 300K (e.g., about 27 degrees Celsius) and the read current and the reference current are measured about 1 second after the writing. A middle graph illustrates the current levels of the read current and the reference current in a second condition in which the resistive memory cells RMC and the reference resistive memory cells RRMC are written at a temperature of about 233K (e.g., about −40 degrees Celsius) and the read current and the reference current are measured about ten years (e.g., about 315360000 seconds) after the writing. A lower graph illustrates the current levels of the read current and the reference current in a third condition in which the resistive memory cells RMC and the reference resistive memory cells RRMC are written at a temperature of about 358K (e.g., about 85 degrees Celsius) and the read current and the reference current are measured about 0.01 second after the writing.

As illustrated in FIG. 7, the current level of the reference current may change corresponding to the current level of the read current depending on the changes in temperature and time, one current level of the reference current may be located between two adjacent current levels of the read current. Thus, it can be seen that the reference currents are appropriately functioning as a reference.

Figure 8:
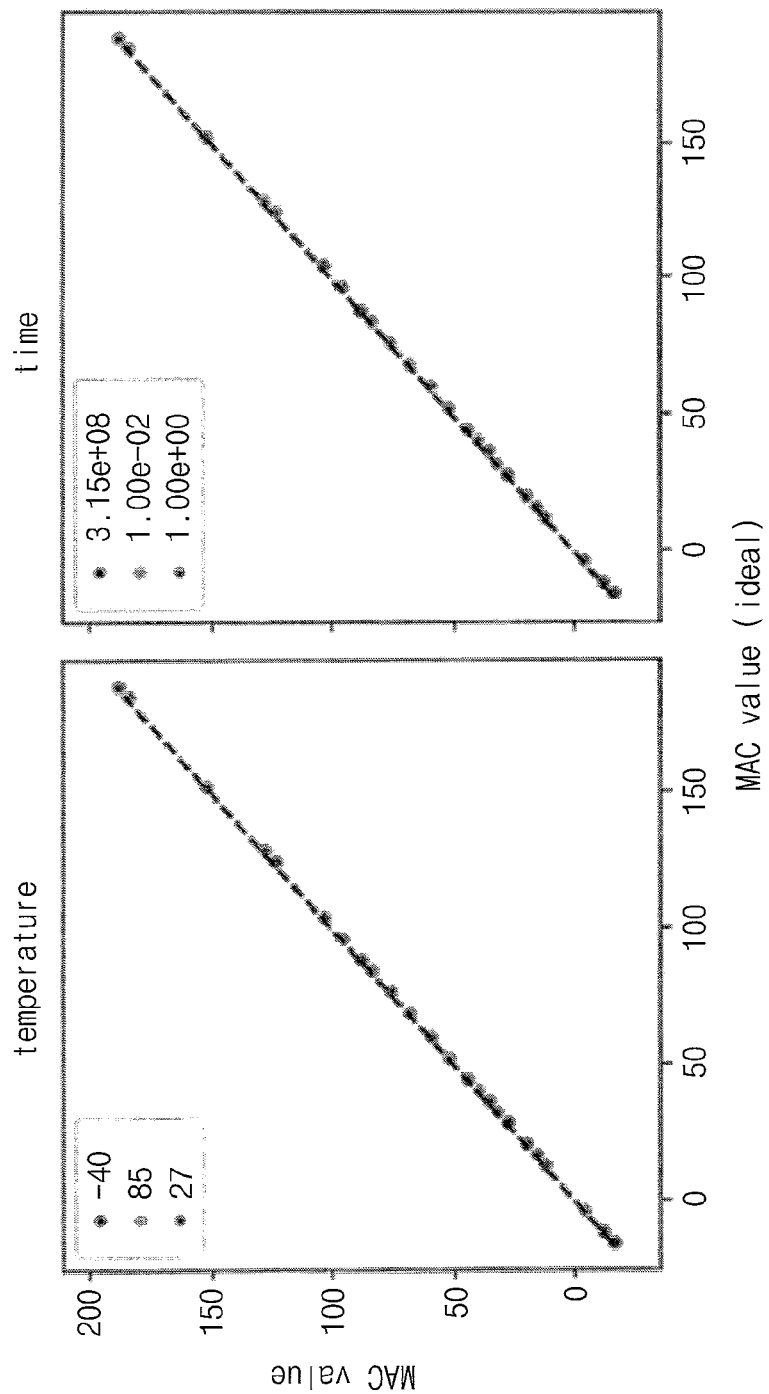

Referring to FIG. 8, a result of determining MAC values (e.g., output values corresponding to the read current) is illustrated when the offset resistors ROFS are implemented in the parallel arrangement according to example embodiments and when the resistances of the plurality of offset resistors ROFS are determined as described with reference to FIG. 6 and Equation 4.

In a graph of FIG. 8, a vertical axis represents an actual MAC value (or real MAC value) that is actually measured, and a horizontal axis represents an ideal MAC value. A graph on the left illustrates a relationship between the ideal MAC value and the actual MAC value when a temperature at which the current is measured changes such as about 233K (e.g., about −40 degrees Celsius), about 358K (e.g., about 85 degrees Celsius) and about 300K (e.g., about 27 degrees Celsius). A graph on the right illustrates a relationship between the ideal MAC value and the actual MAC value when a time (or time interval) from the writing to the measuring changes such as about ten years (e.g., about 315360000 seconds), about 0.01 second and about 1 second.

As illustrated in FIG. 8, it can be seen that the MAC value is determined well without any abnormality even when the temperature and time are changed.

In some example embodiments, when the offset resistors ROFS are implemented in the parallel arrangement according to example embodiments, it is necessary to consider a leakage of each resistive memory cell to guarantee or ensure the maximum sensing margin. For example, a read current output from each resistive memory cell may vary depending on a bit value input to the resistive memory cell and a bit value stored in the resistive memory cell, and thus the resistances of the offset resistors ROFS may be determined in consideration of such variation.

Referring to FIG. 9, a change in the read current depending on an input bit and a stored bit of each resistive memory cell is illustrated.

In each resistive memory cell, an output bit value "x*w" (e.g., an output bit or a level of a read current) may be determined by multiplying a bit value (e.g., an input bit or a level of an input voltage) "x" input through the wordline by a stored bit value "w" (e.g., a weight bit).

As illustrated in FIG. 9, the output bit value x*w may corresponds to '0' when at least one of the input bit value x and the stored bit value w corresponds to '0', and the output bit value x*w may corresponds to '1' when both the input bit value x and the stored bit value w correspond to '1'. When the input bit value x corresponds to '0' and '1', the read current output from each resistive memory cell may correspond to an off-state current Ioff and an on-state current Ion of the cell transistor CT, respectively. When the stored bit value w corresponds to '0' and '1', the read current output from each resistive memory cell may correspond to a high resistance state Rhigh and a low resistance state Rlow of each resistive memory cell, respectively.

Therefore, when the output bit value x*w corresponds to '1', the read current output from each resistive memory cell may correspond to only one case: Ion(Rlow). However, when the output bit value x*w corresponds to '0', the read current output from each resistive memory cell may correspond to one of three cases: Ioff (Rhigh), Ioff (Rlow) and Ioff (Rhigh).

Figure 10:
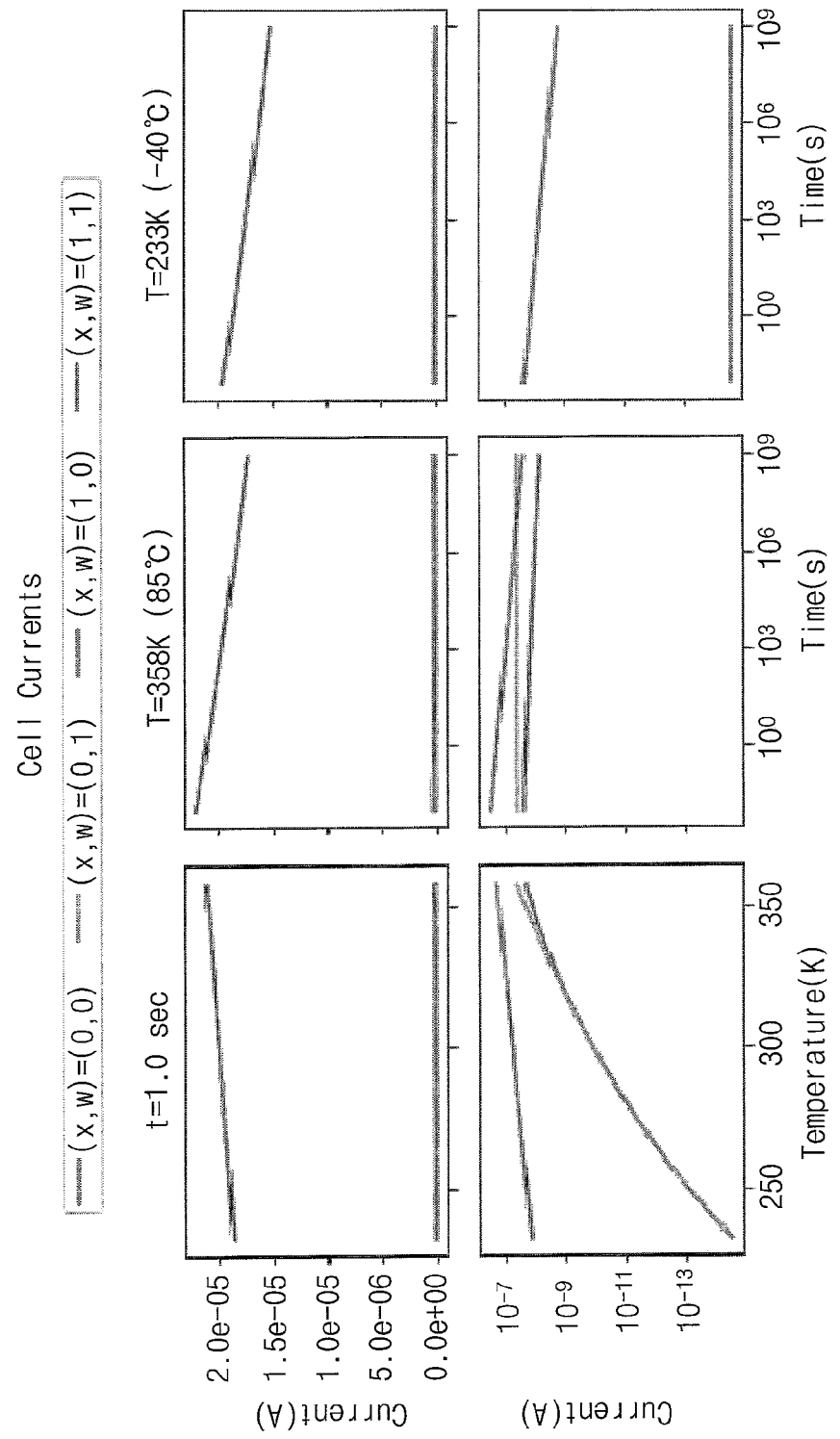

Referring to FIG. 10, changes of the read current (or cell current) in FIG. 9 output from each resistive memory cell depending on changes in temperature and time are illustrated.

In FIG. 10, graphs in a first column represent the change of the read current depending on the change in temperature when the time from the writing to the measuring (e.g., the measuring time) is fixed to about 1 second. Graphs in a second column represent the change of the read current depending on the change in time when the temperature at which the current is measured (e.g., the measuring temperature) is fixed at about 358K (e.g., about 85 degrees Celsius). Graphs in a third column represent the change of the read current depending on the change in time when the temperature at which the current is measured is fixed at about 233K (e.g., about −40 degrees Celsius). In addition, each of graphs in a second row represents an enlarged view of a lower region of a corresponding graph in a first row.

As illustrated in FIG. 10, in cases of Ion(Rlow) and Ion(Rhigh), e.g., in cases of (x,w)=(1,1) and (x,w)=(1,0), it can be seen that the read current depends on temperature and time dependency of the low resistance state Rlow and the high resistance state Rhigh. In addition, in cases of Ioff (Rlow) and Ioff(Rhigh), e.g., in cases of (x,w)=(0,1) and (x,w)=(0,0), it can be seen that the read current depends on temperature and time dependency of the cell transistor CT, the low resistance state Rlow and the high resistance state Rhigh.

Figure 11:
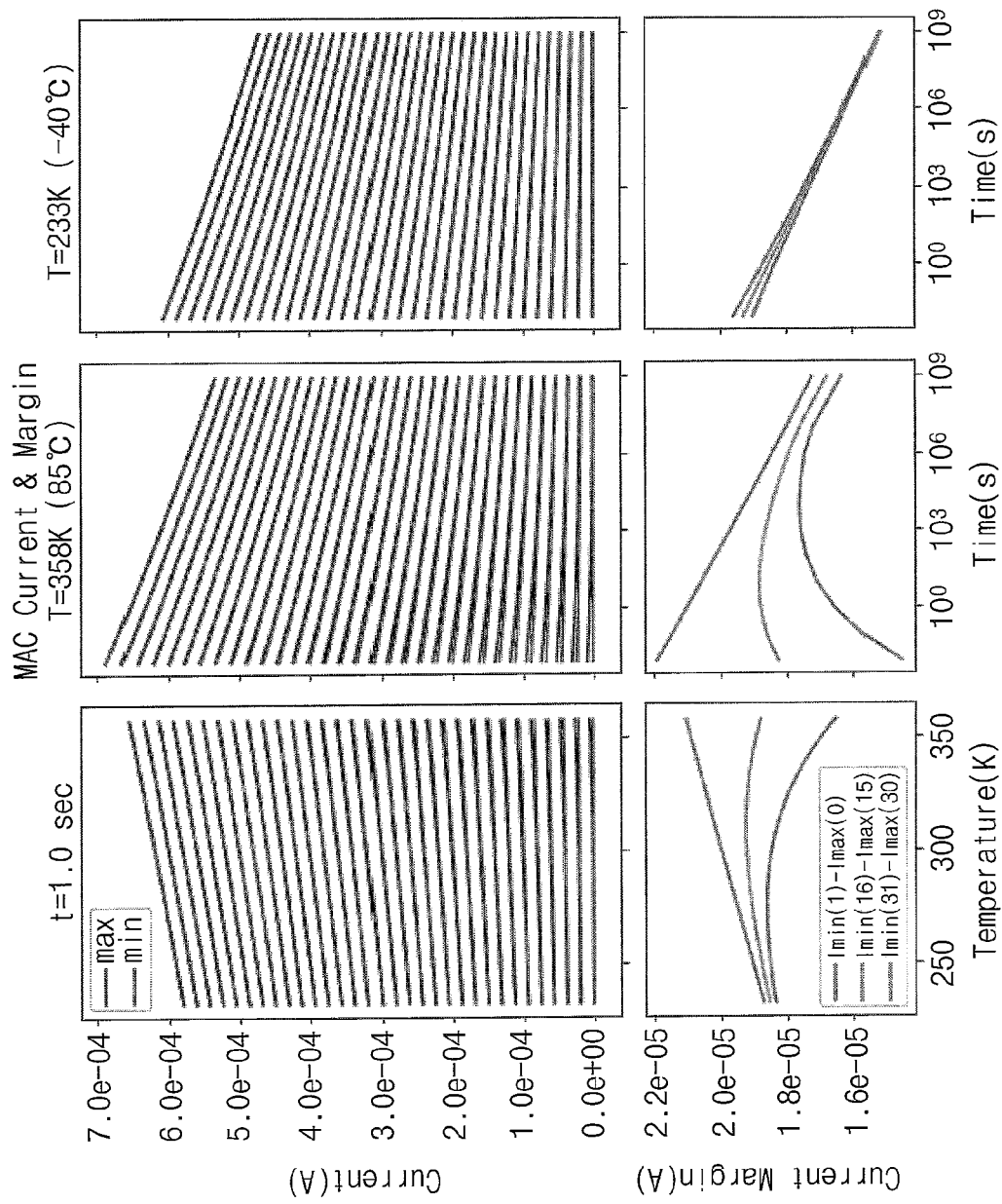

Referring to FIG. 11, temperature and time dependency of a plurality of current levels (e.g., MAC current values) that a read current output from each resistive memory cell may have is illustrated. FIG. 11 illustrates an example in which the number of the reference bitlines RBL1 to RBLn and the number of the wordlines WL1 to WLN are thirty one, e.g., the number of the reference columns is thirty one.

As with that described with reference to FIG. 10, in FIG. 11, graphs in a first column represent the changes of the MAC current values depending on the change in temperature when the time from the writing to the measuring is fixed to about 1 second. Graphs in a second column represent the changes of the MAC current values depending on the change in time when the temperature at which the current is measured is fixed at about 358K (e.g., about 85 degrees Celsius). Graphs in a third column represent the changes of the MAC current values depending on the change in time when the temperature at which the current is measured is fixed at about 233K (e.g., about −40 degrees Celsius).

In FIG. 11, graphs in a first row represent 32 MAC current values from "mac0" at the bottom to "mac31" at the top, and each MAC current value may have a distribution between the maximum value and the minimum value. A read current output from one bitline may have one of the 32 MAC current values. For example, when all bit values output from 31 resistive memory cells connected to one bitline correspond to '0', the read current may have the MAC current value corresponding to "mac0" at the bottom. For example, when all bit values output from 31 resistive memory cells connected to one bitline correspond to '1', the read current may have the MAC current value corresponding to "mac31" at the top. As described with reference to FIG. 6, Equation 2, Equation 3 and Equation 4, mac0 and mac31 may be expressed as I(0) and I(31), respectively.

In addition, in FIG. 11, each of graphs in a second row represents current margins of a corresponding graph in the first row, and each current margin represents an interval between two adjacent MAC current values considering the maximum value and the minimum value. For example, Imin(1)−Imax(0) represents a difference between the minimum value of mac1 and the maximum value of mac0, Imin(16)−Imax(15) represents a difference between the minimum value of mac16 and the maximum value of mac15, and Imin(31)−Imax(30) represents a difference between the minimum value of mac31 and the maximum value of mac30.

As described with reference to FIGS. 9 and 10, when the output bit value x*w corresponds to '0', the read current output from each resistive memory cell may correspond to one of three cases of Ioff (Rhigh), Ioff (Rlow) and Ioff (Rhigh), and thus the MAC current values may also have a distribution based on a combination of the above-described three cases. As illustrated in the graphs in the first row of FIG. 11, a difference between the maximum value and the minimum value of two adjacent MAC current values may be negligible in almost cases. However, as illustrated in the graphs in the second row of FIG. 11, when the temperature at which the current is measured is relatively high and the time from the writing to the measuring is relatively short, e.g., when the resistance is relatively low, the leakage of the cell transistor CT is relatively large and the amount of the cell current is relatively large, a relatively large difference between the maximum value and the minimum value of two adjacent MAC current values may occur (e.g., separation of the maximum and minimum values may occur).

Figure 12:
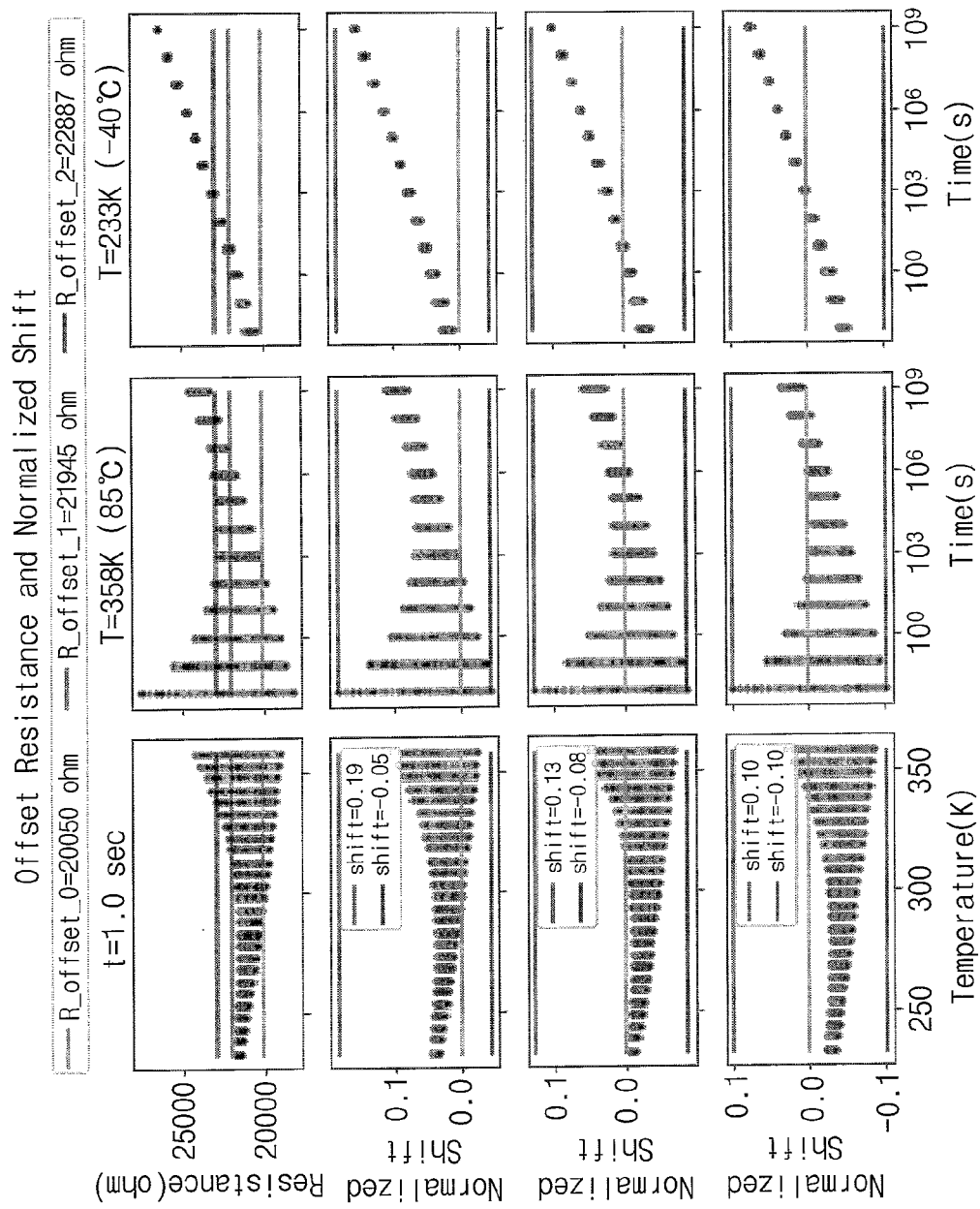
Figure 13:
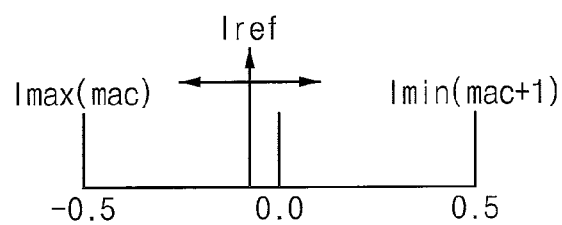

Referring to FIGS. 12 and 13, other examples in which the resistances of the plurality of offset resistors ROFS are determined in consideration of the characteristics described with reference to FIGS. 9, 10 and 11 are illustrated.

In some example embodiments, the resistance of the offset resistor ROFS may be obtained by performing a simulation based on a plurality of sample resistances associated with the reference currents Iref_1 to Iref_n. For example, the resistance of the offset resistor ROFS may be determined based on a median value of the plurality of sample resistances. For another example, the resistance of the offset resistor ROFS may be obtained based on Equation 5 and Equation 6.

$$Roffset = Vread * \frac{a+b}{a*b} \quad \text{[Equation 5]}$$

$$a = I\min(mac+1) - I\max(mac) @ T, \quad \text{[Equation 6]}$$
$$t, col \text{ of shift max}$$

$$b = I\min(mac+1) - I\max(mac) @ T,$$
$$t, col \text{ of shift min}$$

In Equation 5 and Equation 6, "Roffset" denotes the resistance of the offset resistor ROFS, "Vread" denotes a read voltage, "Imax(mac)" denotes the maximum value of a first current level of the plurality of read currents sensed by the at least one reference current, and "Imin(mac+1)" denotes a minimum value of a second current level of the plurality of read currents sensed by the at least one reference current. The first and second current levels may be adjacent to each other. For example, with respect to Equation 2, Equation 3 and Equation 4, "Imax(mac)" represents the maximum value of "I(mac)", and "Imin(mac+1)" represents the minimum value of "I(mac+1)". For example, the plurality of sample resistances may be obtained in consideration of a temperature "T", a time "t" and a reference column "col", and "a" and "b" represent values at which a normalized shift, which will be described later, becomes the maximum and the minimum, respectively.

As with that described with reference to FIGS. 10 and 11, in FIG. 12, graphs in a first column represent the changes of the MAC current values depending on the change in temperature when the time from the writing to the measuring is fixed to about 1 second. Graphs in a second column represent the changes of the MAC current values depending on the change in time when the temperature at which the current is measured is fixed at about 358K (e.g., about 85 degrees Celsius). Graphs in a third column represent the changes of the MAC current values depending on the change in time when the temperature at which the current is measured is fixed at about 233K (e.g., about −40 degrees Celsius).

In FIG. 12, graphs in a first row represent a distribution of the plurality of sample resistances and an example of the resistances of the offset resistors ROFS. The plurality of sample resistances may be set depending on given ranges of temperature and time range and reference columns. "R_offset_0" represents the resistances of the offset resistors ROFS determined based on Equations 2-4, "R_offset_1" represents the resistances of the offset resistors ROFS determined based on the median value of the plurality of sample resistances, and "R_offset_2" represents the resistances of the offset resistors ROFS determined based on Equations 5 and 6. For example, R_offset_0 may be determined to be about 20050Ω, R_offset_1 may be determined to be about 21945Ω, and R_offset_2 may be determined to be about 22887Ω.

In addition, in FIG. 12, graphs in a second row represent a normalized shift with respect to R_offset_0, graphs in a third row represent a normalized shift with respect to R_offset_1, and graphs in a fourth row represent a normalized shift with respect to R_offset_2. For example, the normalized shift may be defined as illustrated in FIG. 13.

As described with reference to FIGS. 9, 10 and 11, the interval between adjacent MAC current values (e.g., the MAC current margin) may depend on the temperature, the time and the reference column, and thus the resistance of the offset resistor may also depend on the temperature, the time and the reference column. As described with reference to FIG. 6, the resistance of the offset resistor, which is obtained at the measuring temperature of about 300 K and the measuring time of about 1 second by considering only the interval between the maximum values of adjacent MAC current values and by ignoring the dependency of temperature, time and reference column, may be defined as "R_offset_0". In addition, the resistance of the offset resistor, which is obtained by arranging the plurality of sample resistances in order of magnitude and by selecting a resistance corresponding to the median value, may be defined as "R_offset_1". As illustrated in the graphs in the second row of FIG. 12, when the resistance of the offset resistor is obtained by R_offset_0, the normalized shift may be biased to one side in given ranges of temperature and time, and the sensing margin may be decreased, thereby reducing a range of distribution and/or limiting ranges of temperature and time. As illustrated in the graphs in the third row of FIG. 12, when the resistance of the offset resistor is obtained by R_offset_1 to improve or enhance the sensing margin, the normalized shift may be improved, but may be still biased to one side.

Therefore, the resistance of the offset resistor may be determined such that the normalized shift is symmetrical. From a condition of "shift_max+shift_min=0" at given ranges of temperature and time, the resistance of the offset resistor may be obtained based on Equation 5 and Equation 6, and may be defined as "R_offset_2". As illustrated in the graphs in the fourth row of FIG. 12, when the resistance of the offset resistor is obtained by R_offset_2, the normalized shift may be symmetrically formed over the given ranges of temperature and time, and thus the maximum sensing margin may be obtained.

Figure 14:
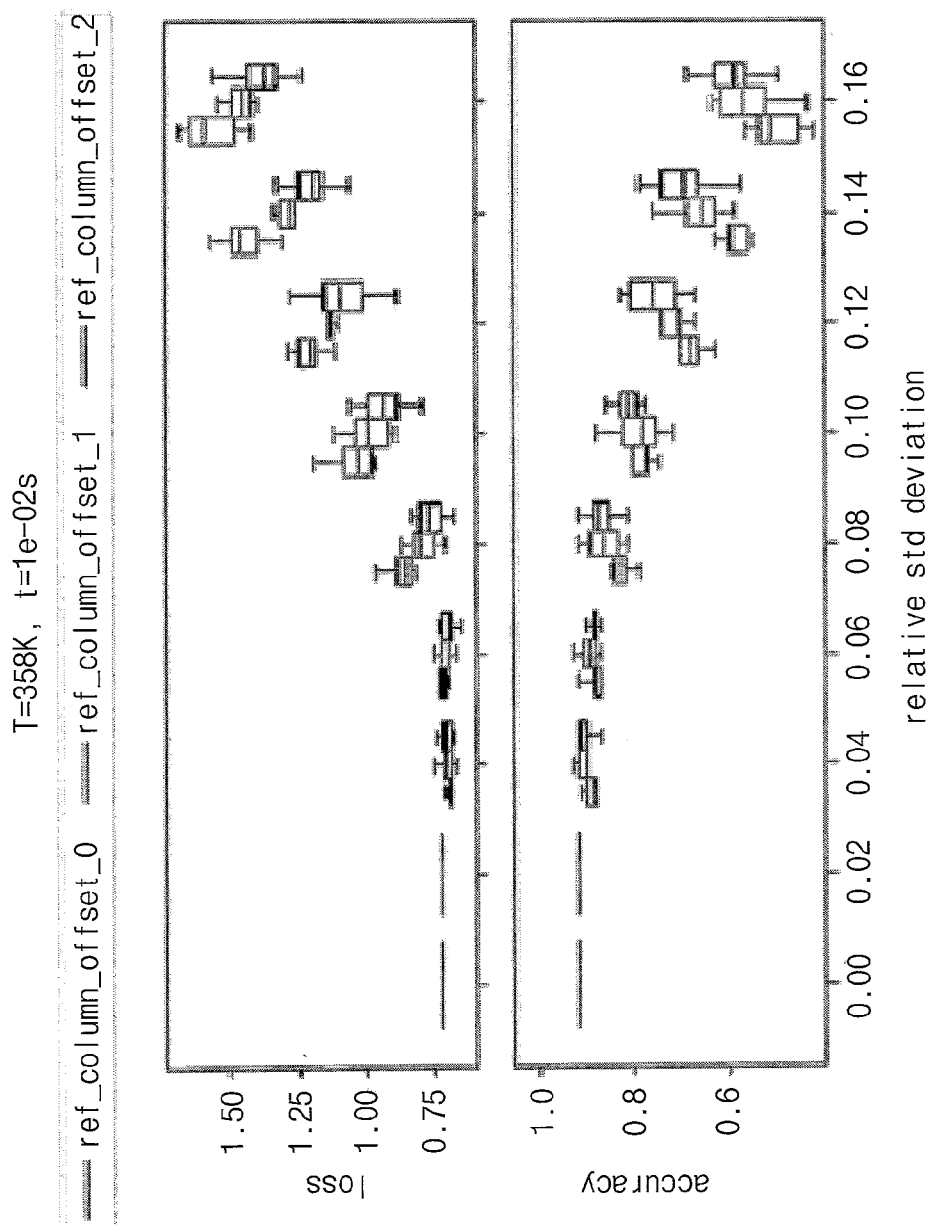
Figure 15:
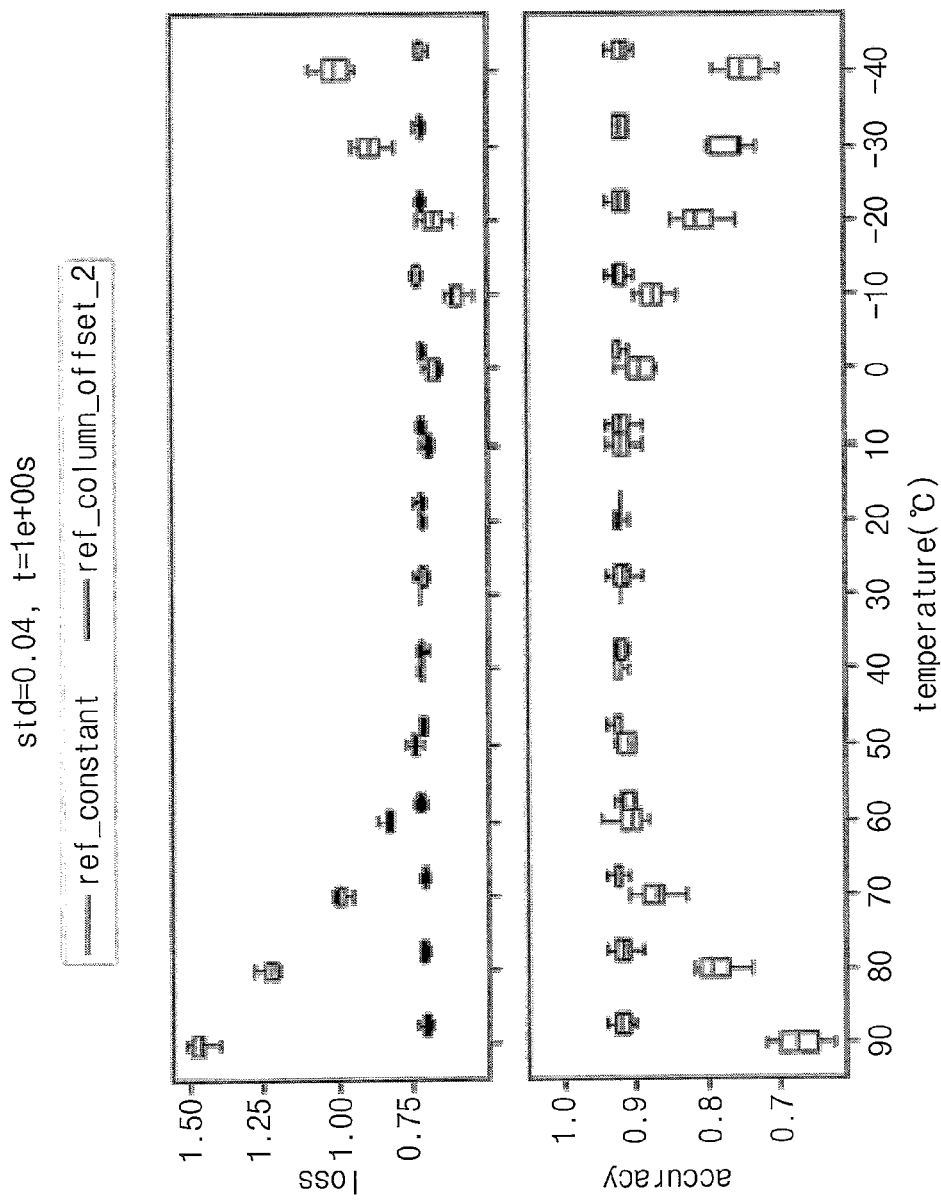
Figure 16:
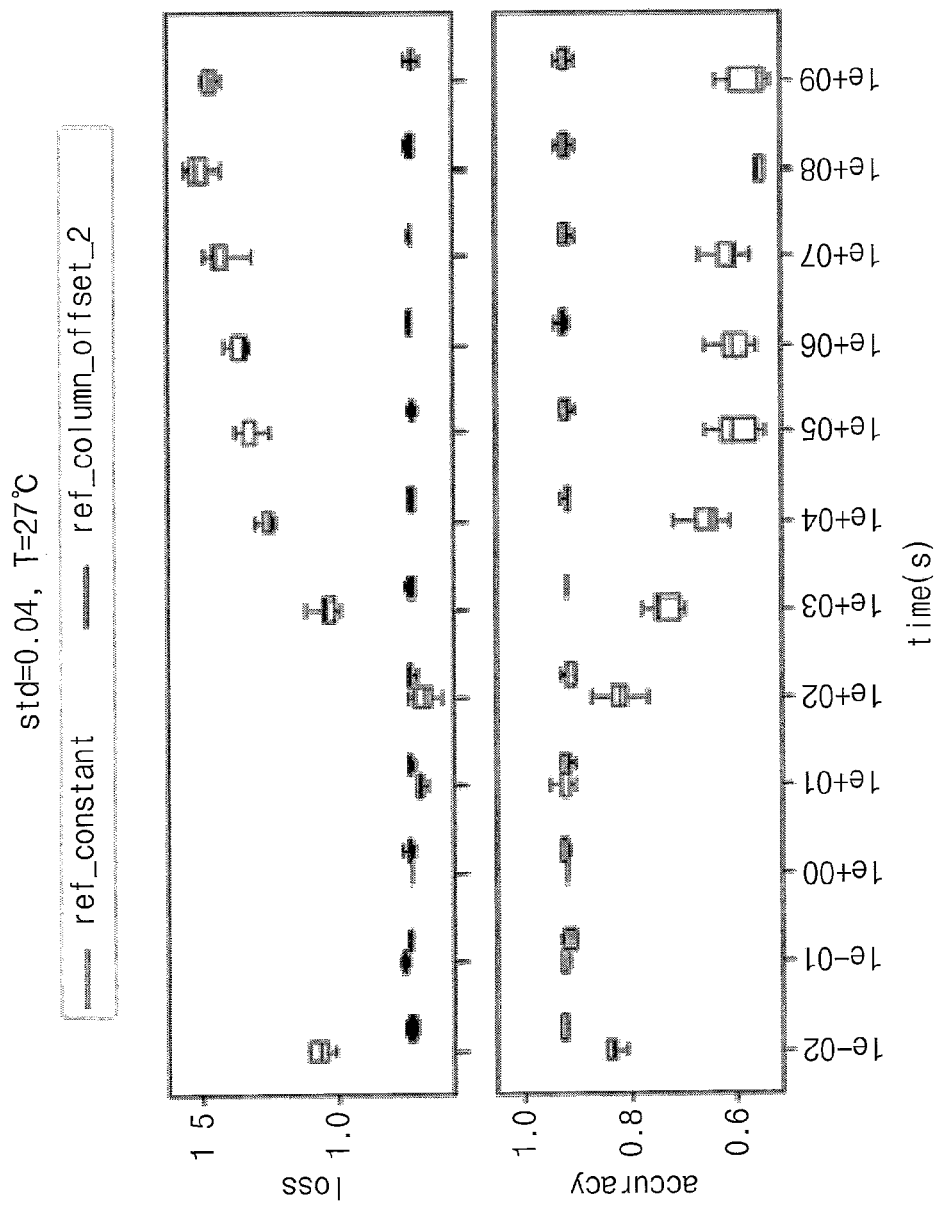

Referring to FIGS. 14, 15 and 16, the performance of the neuromorphic computing device 10 is illustrated when the resistance of the offset resistor ROFS is determined according to example embodiments. In FIGS. 14, 15 and 16, "ref_column_offset_0", "ref_column_offset_1" and "ref_column_offset_2" represent examples in which the resistance of the offset resistor is determined or obtained by R_offset_0, R_offset_1 and R_offset_2, respectively, and loss and accuracy are measured for each example. In FIGS. 15 and 16, "ref_constant" represents a comparative example to which example embodiments are not applied.

As illustrated in FIG. 14, it can be seen that ref_column_offset_2 has performance better than those of ref_column_offset_0 and ref_column_offset_1. In the simulation of FIG. 14, MNIST 768-512-128-10 affine model was used, and the learning result accuracy was about 0.979. After that, the weights and activations were quantized to 3 bits and used for inference, and the accuracy after the quantization was about 0.913. Results of FIG. 14 are boxplots illustrating the results of 10 repetitions for each condition to consider the random characteristics of the distribution. The results of FIG. 14 were calculated for 100 specific images each time due to the limitation of the simulation time.

As illustrated in FIGS. 15 and 16, it can be seen that ref_column_offset_2 maintains the accuracy regardless of temperature and time, as compared with ref_constant. Accordingly, it can be seen that the maximum sensing margin is ensured and the maximum accuracy is obtained by ref_column_offset_2 in which the offset resistors having the same resistance are connected to the reference columns in the parallel arrangement and the resistances of the offset resistors are determined such that that the normalized shift is symmetrically formed.

In summary, if the MAC current values exist from mac0 to mac31 (or from I(0) to I(31)), the current level of the reference current may exist from $I_{REF}(0)$ for distinguishing between mac0 and mac1 to $I_{REF}(30)$ for distinguishing between mac30 and mac31. For example, $I_{REF}(0)$ may correspond to the current level of the first reference current Iref_1, $I_{REF}(30)$ may correspond to the current level of the n-th reference current Iref_n, and the current levels may sequentially increase from $I_{REF}(0)$ to $I_{REF}(30)$. For example, the resistance of the offset resistor ROFS may be determined by a first scheme based on Equation 4. For another example, the resistance of the offset resistor ROFS may be determined by a second scheme based on the median value of the plurality of sample resistances. Alternatively, the resistance of the offset resistor ROFS may be determined by a third scheme based on Equations 5 and 6. For example, the second scheme may have performance better than that of the first scheme, and the third scheme may have performance better than that of the second scheme.

Figure 17:
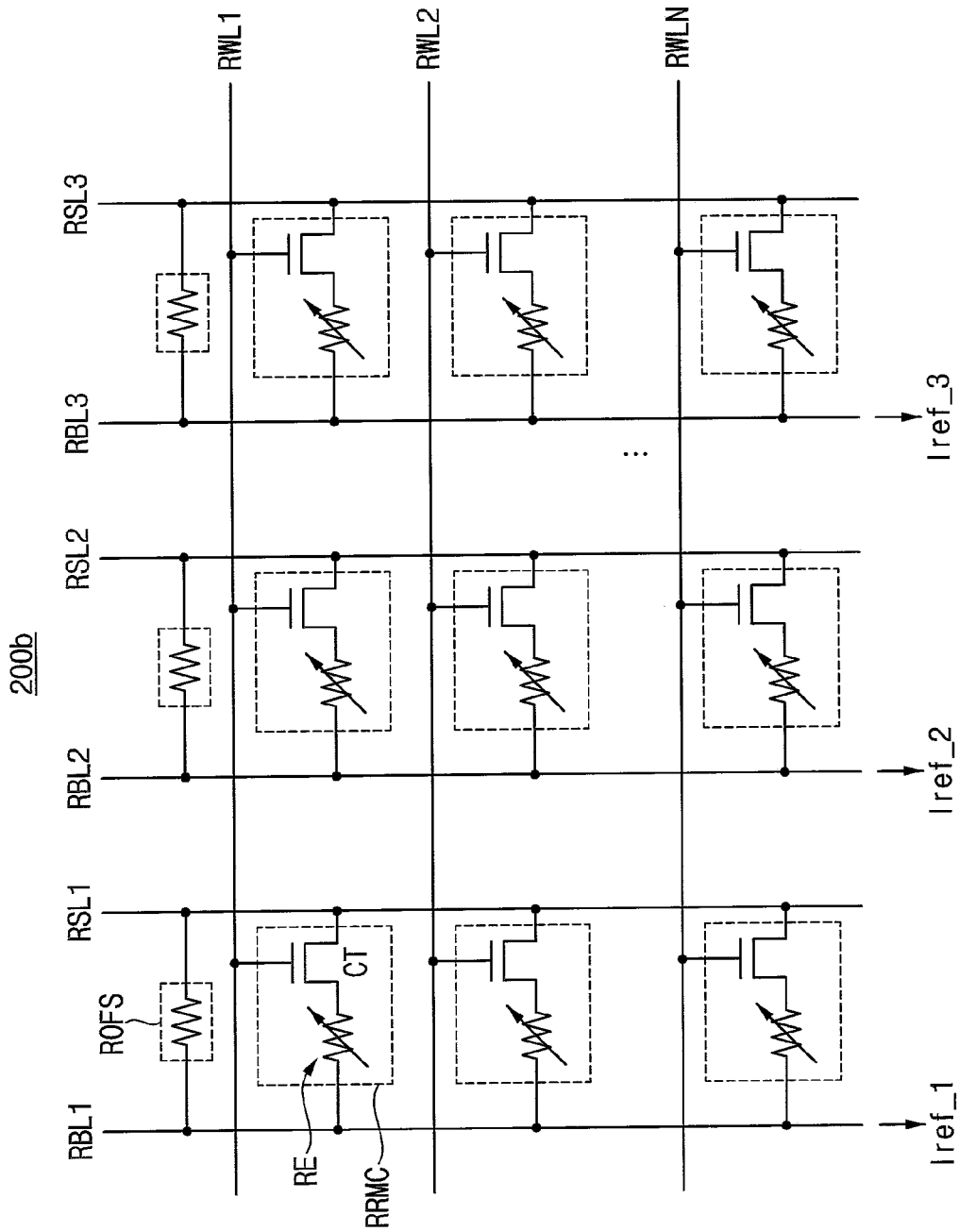
FIG. 17 is a diagram illustrating an example of a second memory cell array included in a neuromorphic computing device according to example embodiments.

FIG. 17 is a diagram illustrating an example of a second memory cell array included in a neuromorphic computing device according to example embodiments.

Referring to FIG. 17, a second memory cell array 200b may include three reference bitlines RBL1, RBL2 and RBL3, and three reference source lines RSL1, RSL2 and RSL3, and may output three reference currents Iref_1, Iref_2 and Iref_3. In other words, FIG. 17 illustrates an example in which n=3 in the second memory cell array 200a of FIG. 4. In one embodiment, each of the plurality of digital signals DS_1 to DS_M may be a 2-bit digital signal. The descriptions repeated with FIG. 4 will be omitted.

Figure 18:
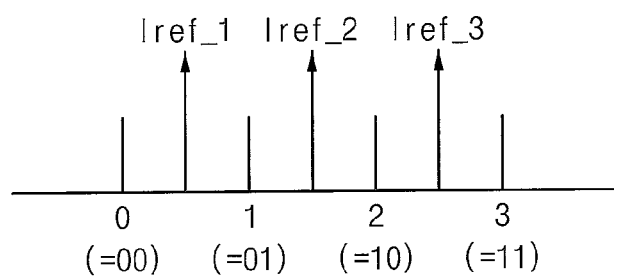
FIG. 18 is a diagram for describing an operation of an analog-to-digital converting circuit using a second memory cell array of FIG. 17.

FIG. 18 is a diagram for describing an operation of an analog-to-digital converting circuit using a second memory cell array of FIG. 17.

Referring to FIG. 18, the analog-to-digital converting circuit 400 may convert the read current into the digital signal using the reference currents Iref_1, Iref_2 and Iref_3.

For example, when the first read current Iread_1 is less than the first reference current Iref_1, the analog-to-digital converting circuit 400 may output '00' as the first digital signal DS_1 corresponding to the first read current Iread_1. When the first read current Iread_1 is greater than or equal to the first reference current Iref_1 and less than the second reference current Iref_2, the analog-to-digital converting circuit 400 may output '01' as the first digital signal DS_1 corresponding to the first read current Iread_1. When the first read current Iread_1 is greater than or equal to the second reference current Iref_2 and less than the third reference current Iref_3, the analog-to-digital converting circuit 400 may output '10' as the first digital signal DS_1 corresponding to the first read current Iread_1. When the first read current Iread_1 is greater than or equal to the third reference current Iref_3, the analog-to-digital converting circuit 400 may output '11' as the first digital signal DS_1 corresponding to the first read current Iread_1.

In some example embodiments, a range of an operating voltage of the analog-to-digital converting circuit 400 may be uniformly (or equally) or non-uniformly (or unequally) divided using the reference currents Iref_1, Iref_2 and Iref_3 by controlling or adjusting the number and/or ratio of cells having the high resistance state FIRS and cells having the low resistance state among the reference resistive memory cells RRMC connected to one reference bitline of the second memory cell array 200b.

Figure 19A:
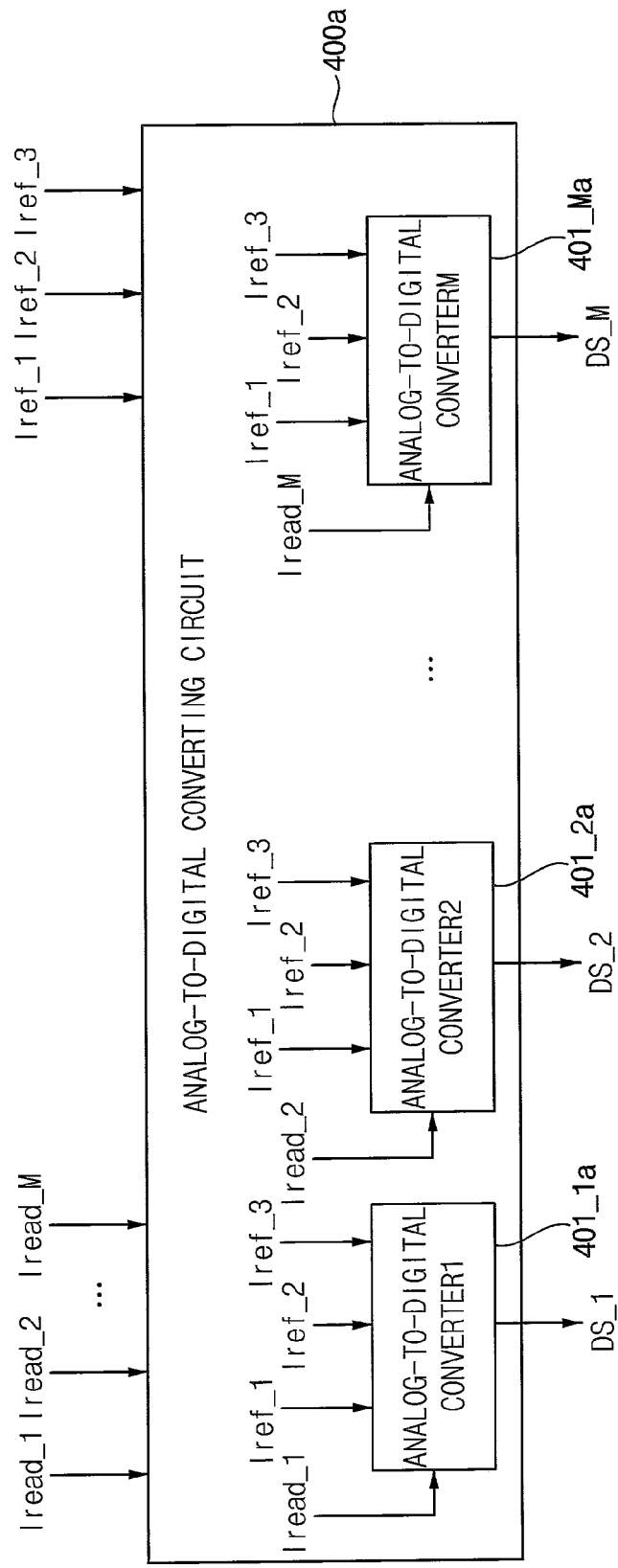
FIGS. 19A and 19B are block diagrams illustrating examples of an analog-to-digital converting circuit using a second memory cell array of FIG. 17.
Figure 19B:
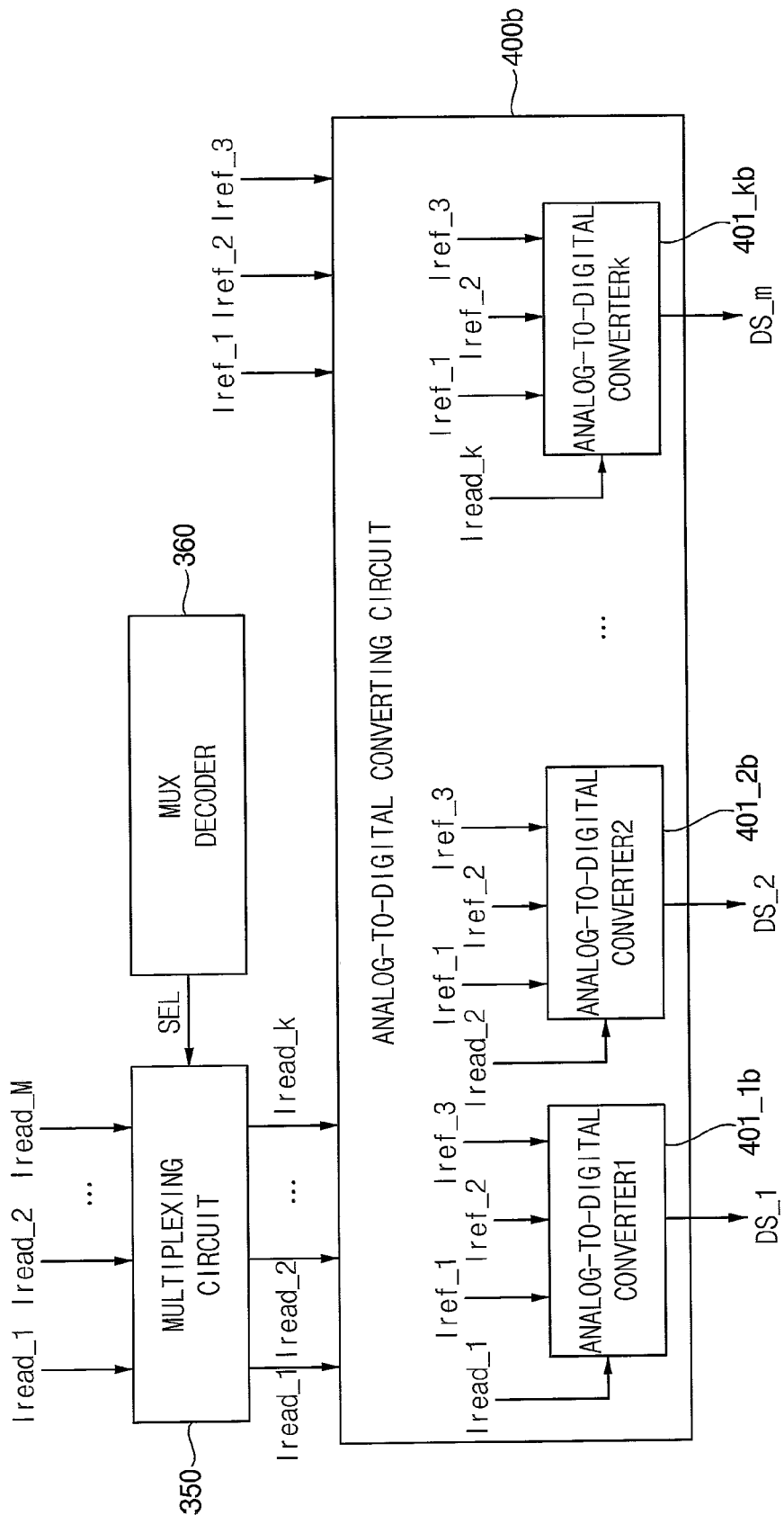

FIGS. 19A and 19B are block diagrams illustrating examples of an analog-to-digital converting circuit using a second memory cell array of FIG. 17.

Referring to FIG. 19A, an analog-to-digital converting circuit 400a may include a plurality of analog-to-digital converters 401_1a, 401_2a, . . . , 401_Ma. In an example of FIG. 19A, the number of the plurality of analog-to-digital converters 401_1a to 401_Ma may be substantially equal to the number of the plurality of read currents Iread_1 to Iread_M. Each analog-to-digital converter may also be described as an analog-to-digital converter sub-circuit.

The first analog-to-digital converter 401_1a may convert the first read current Iread_1 into the first digital signal DS_1 based on the reference currents Iref_1, Iref_2 and Iref_3. Similarly, the second analog-to-digital converter 401_2a may convert the second read current Iread_2 into the second digital signal DS_2 based on the reference currents Iref_1, Iref_2 and Iref_3. The M-th analog-to-digital converter 401_Ma may convert the M-th read current Iread_M into the M-th digital signal DS_M based on the reference currents Iref_1, Iref_2 and Iref_3.

Referring to FIG. 19B, an analog-to-digital converting circuit 400b may include a plurality of analog-to-digital converters 401_1b, 401_2b, . . . , 401_kb. A neuromorphic computing device including the analog-to-digital converting circuit 400b may further include a multiplexing circuit 350 and a MUX decoder 360 that are disposed between the first memory cell array 100 and the analog-to-digital converting circuit 400b. In an example of FIG. 19B, the number of the plurality of analog-to-digital converters 401_1b to 401_kb may be less than the number of the plurality of read currents Iread_1 to Iread_M (e.g., k is a natural number greater than or equal to two and less than M).

The multiplexing circuit 350 may select k read currents from among the M read currents based on a selection signal SEL, may output and provide the selected read currents to the analog-to-digital converting circuit 400b. For example, the multiplexing circuit 350 may select the first to k-th read currents Iread_1 to Iread_k from among the first to M-th read currents Iread_1 to Iread_M based on the selection signal SEL, and may provide the first to k-th read currents Iread_1 to Iread_k to the analog-to-digital converting circuit 400b.

The MUX decoder 360 may generate the selection signal SEL used for selecting the read currents, and may provide the selection signal SEL to the multiplexing circuit 350.

The first analog-to-digital converter 401_1b may convert the first read current Iread_1 into the first digital signal DS_1 based on the reference currents Iref_1, Iref_2 and Iref_3. Similarly, the second analog-to-digital converter 401_2b may convert the second read current Iread_2 into the second digital signal DS_2 based on the reference currents Iref_1, Iref_2 and Iref_3. The k-th analog-to-digital converter 401_kb may convert the k-th read current Iread_k into the k-th digital signal DS_k based on the reference currents Iref_1, Iref_2 and Iref_3.

Figure 20:
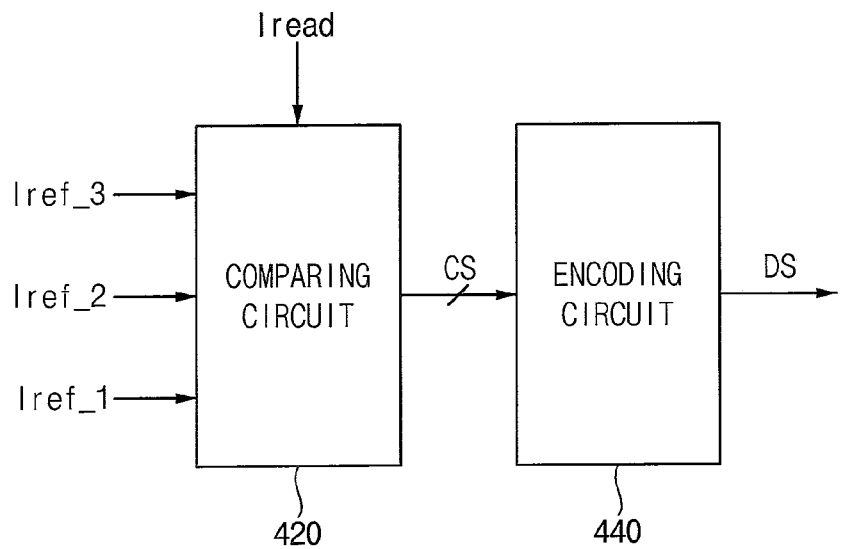
FIGS. 20 and 21 are block diagrams illustrating examples of an analog-to-digital converter included in analog-to-digital converting circuits of FIGS. 19A and 19B.
Figure 21:
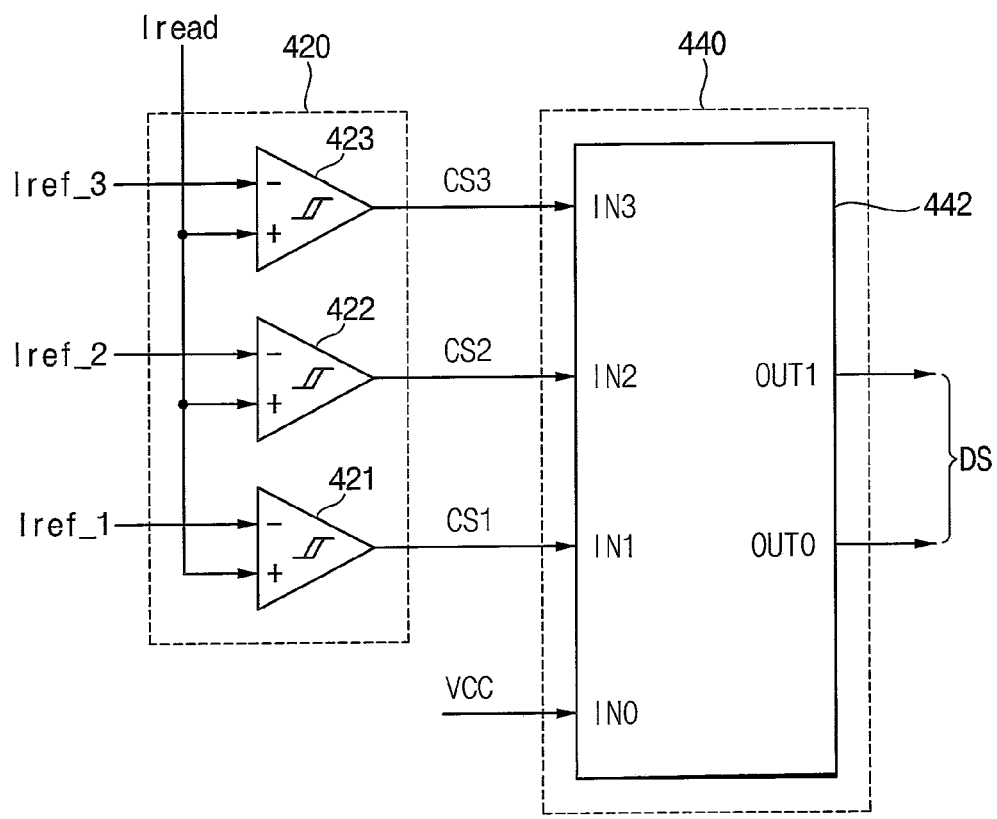

FIGS. 20 and 21 are block diagrams illustrating examples of an analog-to-digital converter included in analog-to-digital converting circuits of FIGS. 19A and 19B.

Referring to FIG. 20, an analog-to-digital converter 401 may include a comparing circuit 420 and an encoding circuit 440. The analog-to-digital converter 401 may correspond to one of the analog-to-digital converters 401_1a to 401_Ma in FIG. 19A and/or one of the analog-to-digital converters 401_1b to 401_kb in FIG. 19B.

The analog-to-digital converter 401 may convert a corresponding read current Iread into a corresponding digital signal DS based on the reference currents Iref_1, Iref_2 and Iref_3, and may output the digital signal DS. For example, the analog-to-digital converter 401 may generate and output the digital signal DS by comparing the read current Iread with the reference currents Iref_1, Iref_2 and Iref_3.

The comparing circuit 420 may generate and output a plurality of comparison signals CS by comparing the read current Iread with the reference currents Iref_1, Iref_2 and Iref_3. The comparing circuit 420 may provide the plurality of comparison signals CS to the encoding circuit 440.

The encoding circuit 440 may generate and output the digital signal DS corresponding to the read current Iread based on the plurality of comparison signals CS.

Referring to FIG. 21, an analog-to-digital converter 401 may include a comparing circuit 420 and an encoding circuit 440, the comparing circuit 420 may include a first comparator 421, a second comparator 422 and a third comparator 423, and the encoding circuit 440 may include an encoder 442. FIG. 21 illustrates an example of the analog-to-digital converter 401 of FIG. 20.

The first comparator 421 may generate a first comparison signal CS1 by comparing the read current Iread with the first reference current Iref_1. For example, when the read current Iread is greater than the first reference current Iref_1, the first comparator 421 may generate the first comparison signal CS1 having a first logic level '1'. When the read current Iread is not greater than (e.g., less than or equal to) the first reference current Iref_1, the first comparator 421 may generate the first comparison signal CS1 having the second logic level '0'.

The second comparator 422 may generate a second comparison signal CS2 by comparing the read current Iread with the second reference current Iref_2. The third comparator 423 may generate a third comparison signal CS3 by comparing the read current Iread with the third reference current Iref_3. Operations of the second comparator 422 and the third comparator 423 may be similar to that of the first comparator 421.

The encoder 442 may include a first input terminal IN0 receiving a power supply voltage VCC, a second input terminal IN1 receiving the first comparison signal CS1, a third input terminal IN2 receiving the second comparison signal CS2, a fourth input terminal IN3 receiving the third comparison signal CS3, a first output terminal OUT0 outputting a first bit of the digital signal DS, and a second output terminal OUT1 outputting a second bit of the digital signal DS. The encoder 442 may generate and output a digital signal DS having two bits based on the comparison signals CS1, CS2 and CS3.

Figure 22:
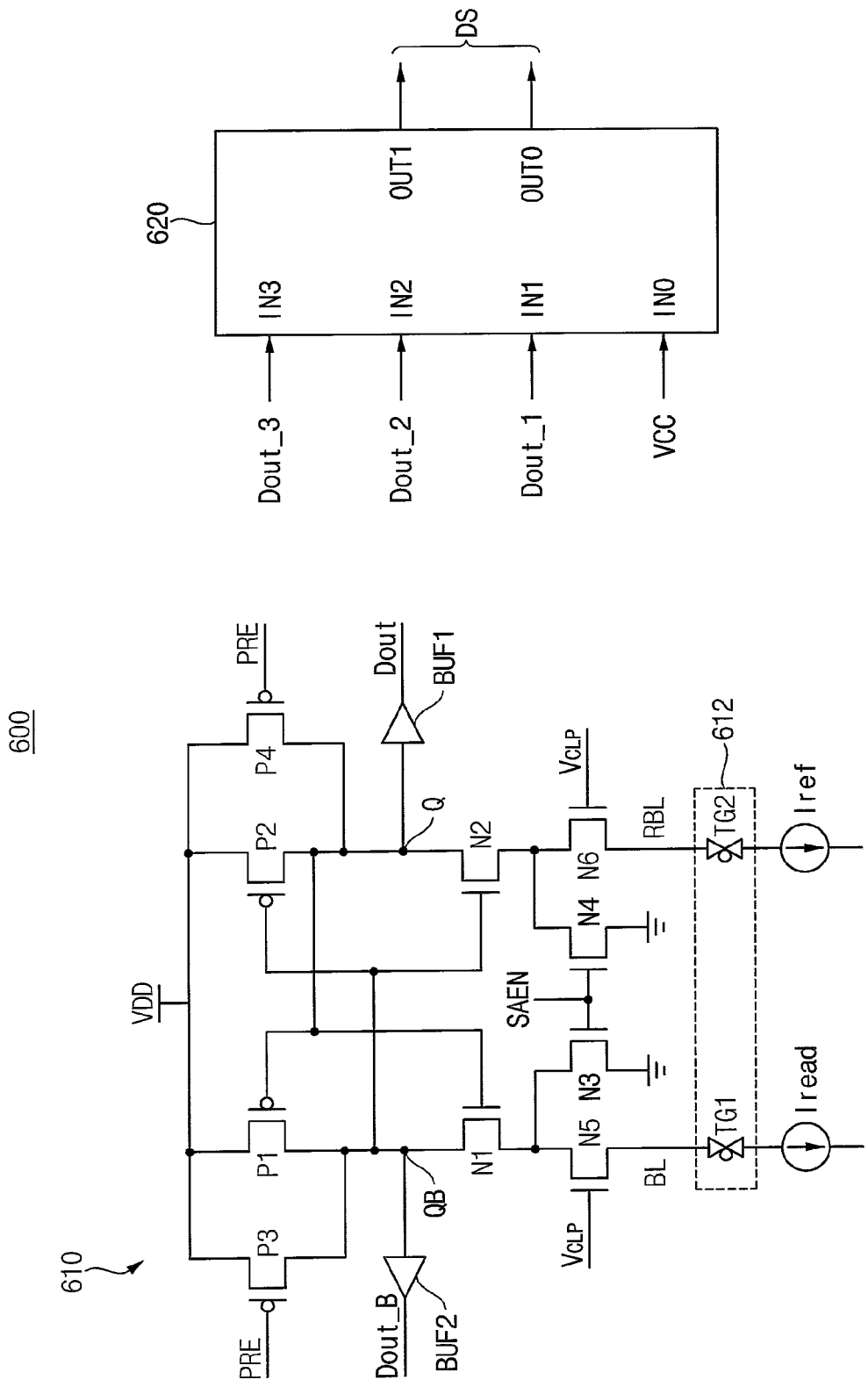
FIG. 22 is a diagram illustrating an example of a sense amplifier circuit and an encoder included in a neuromorphic computing device according to example embodiments.

FIG. 22 is a diagram illustrating an example of a sense amplifier circuit and an encoder included in a neuromorphic computing device according to example embodiments.

Referring to FIG. 22, a sense amplifier circuit 610 and an encoder 620 may correspond to a part of the analog-to-digital converting circuit 400. In other words, a part of the analog-to-digital converting circuit 400 may be implemented as the sense amplifier circuit 610 and the encoder 620.

The sense amplifier circuit 610 may include transistors P1, P2, P3, P4, N1, N2, N3, N4, N5 and N6, and buffers BUF1 and BUF2, and may be connected and implemented as illustrated in FIG. 22. The sense amplifier circuit 610 may be connected to a selecting circuit 612 including transfer gates TG1 and TG2, may be connected to a corresponding bitline BL and a corresponding reference bitline RBL through the selecting circuit 612, and may receive a corresponding read current Iread and a corresponding reference current Iref through the selecting circuit 612. The sense amplifier circuit 610 may generate signals Dout and Dout B corresponding to the read current Iread based on voltages and signals VDD, PRE, $V_{CLP}$ and SAEN and the reference current Iref.

The encoder 620 may include input terminals IN0, IN1, IN2 and IN3 receiving the power supply voltage VCC and the signals Dout_1, Dout_2 and Dout_3, and output terminals OUT0 and OUT1 outputting bits of the digital signal DS. The encoder 620 may be similar to the encoder 442 in FIG. 21.

For example, when the first read current Iread_1 is received, the sense amplifier circuit 610 may provide the signal Dout that is generated based on the first read current Iread_1 and the first reference current Iref_1 as the signal Dout_1, and then may provide the signal Dout that is generated based on the first read current Iread_1 and the second reference current Iref_2 as the signal Dout_2, and then may provide the signal Dout that is generated based on the first read current Iread_1 and the third reference current Iref_3 as the signal Dout_3. The encoder 620 may generate the first digital signal DS_1 corresponding to the first read current Iread_1 based on the signals Dout_1, Dout_2 and Dout_3.

In some example embodiments, the analog-to-digital converting circuit 400 may include a plurality of sense amplifier circuits 610. When the number of sense amplifier circuits included in the analog-to-digital converting circuit 400 increases, the analog-to-digital converting operation may be implemented in parallel.

Figure 23:
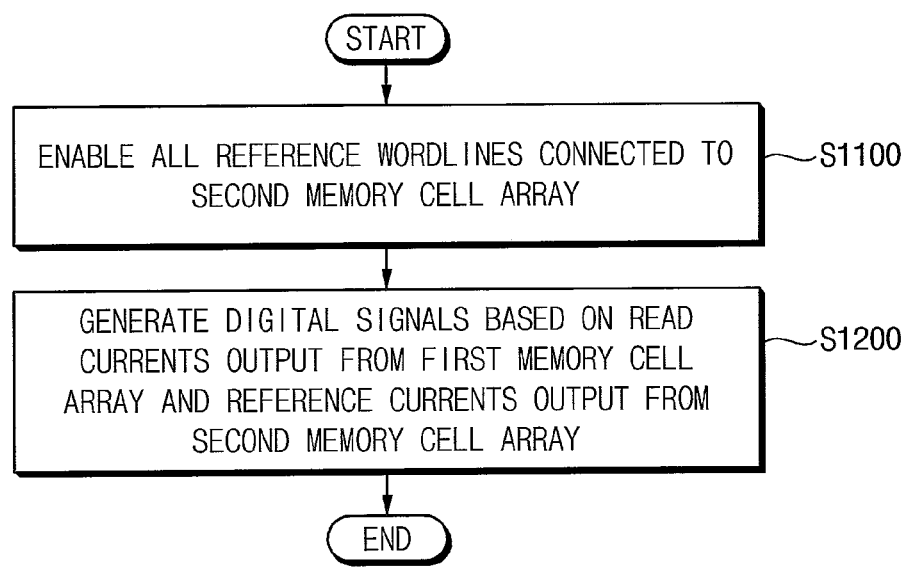
FIG. 23 is a flowchart illustrating a method of operating a neuromorphic computing device according to example embodiments.

FIG. 23 is a flowchart illustrating a method of operating a neuromorphic computing device according to example embodiments.

Referring to FIGS. 1 and 23, in a method of operating a neuromorphic computing device according to example embodiments, all of the reference wordlines RWL1 to RWLN connected to the second memory cell array 200 are enabled by the wordline driver 300 included in the neuromorphic computing device 10 (step S1100).

The digital signals DS_1 to DS_M are generated by the analog-to-digital converting circuit 400 included in the neuromorphic computing device 10 based on the read currents Iread_1 to Iread_M output from the first memory cell array 100 and the reference currents Iref_1 to Iref_n output from the second memory cell array 200 (step S1200). For example, the read currents Iread_1 to Iread_M may be converted into the digital signals DS_1 to DS_M based on the reference currents Iref_1 to Iref_n, and the digital signals DS_1 to DS_M may be output.

Figure 24:
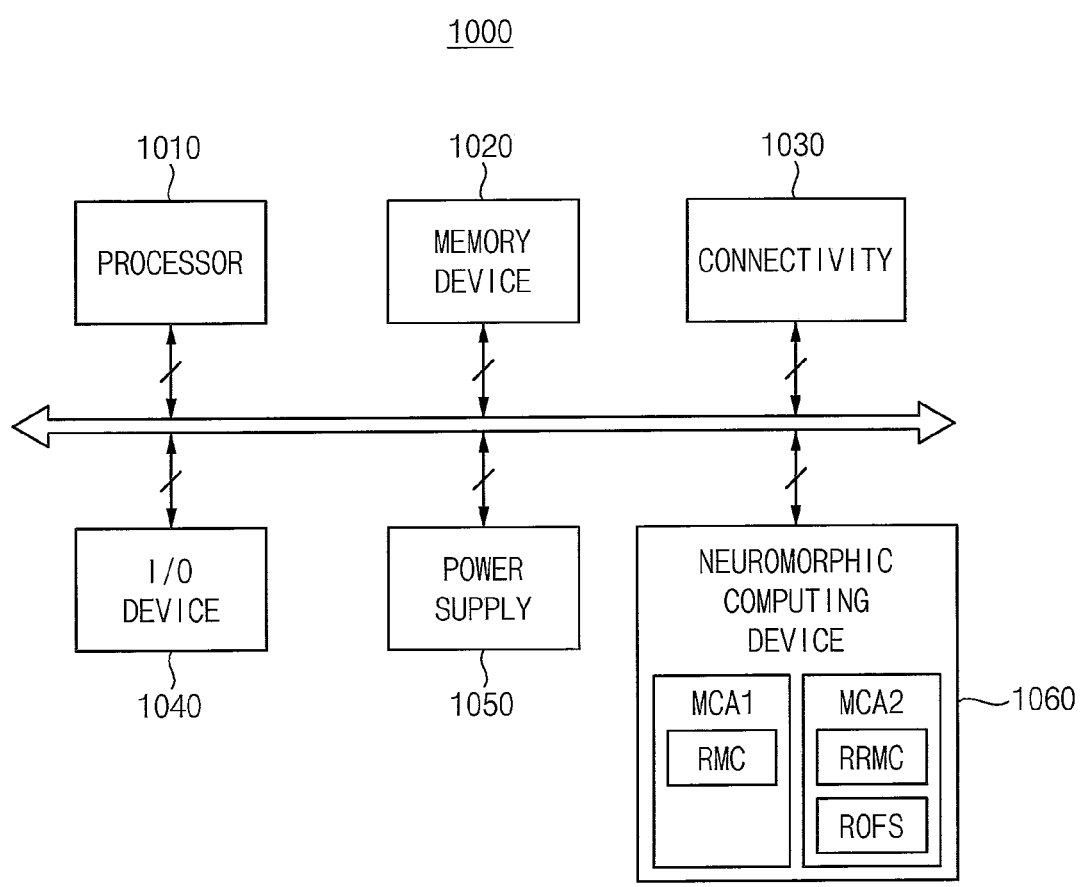
FIG. 24 is a block diagram illustrating an electronic system according to example embodiments.

FIG. 24 is a block diagram illustrating an electronic system according to example embodiments.

Referring to FIG. 24, an electronic system 1000 may include a processor 1010, a memory device 1020, a connectivity 1030, an input/output (I/O) device 1040, a power supply 1050 and a neuromorphic computing device 1060. The electronic system 1000 may further include a plurality of ports for communicating a video card, a sound card, a memory card, a universal serial bus (USB) device, other electronic devices, etc.

The processor 1010 controls operations of the electronic system 1000. The processor 1010 may execute an operating system and at least one application to provide an internet browser, games, videos, or the like. The memory device 1020 may store data for operations of the electronic system 1000. The connectivity 1030 may communicate with an external device (not illustrated). The I/O device 1040 may include an input device such as a keyboard, a keypad, a mouse, a touchpad, a touch-screen, a remote controller, etc., and an output device such as a printer, a speaker, etc. The power supply 1050 may provide a power for operations of the electronic system 1000.

The neuromorphic computing device 1060 may drive and/or execute a neural network system, and may be the neuromorphic computing device 10 according to example embodiments. The neuromorphic computing device 1060 may include a first memory cell array MCA1 including resistive memory cells RMC, and a second memory cell array MCA2 including reference resistive memory cells RRMC and offset resistors ROFS implemented in the parallel arrangement.

The inventive concept may be applied to various electronic devices and systems that include the neuromorphic computing devices and/or the neural network systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A neuromorphic computing device comprising:
   a first memory cell array including a plurality of resistive memory cells, configured to store a plurality of data, configured to generate a plurality of read currents based on a plurality of input signals and the plurality of data, and configured to output the plurality of read currents through a plurality of bitlines or a plurality of source lines;
   a second memory cell array including a plurality of reference resistive memory cells and at least one offset resistor, and configured to output at least one reference current through at least one reference bitline or at least one reference source line; and
   an analog-to-digital converting circuit configured to convert the plurality of read currents into a plurality of digital signals based on the at least one reference current, and
   wherein the at least one offset resistor is connected between the at least one reference bitline and the at least one reference source line.

2. The neuromorphic computing device of claim 1, wherein:
   a resistance of the at least one offset resistor is determined based on a first resistance and a second resistance,
   the first resistance corresponds to a high resistance state of the plurality of reference resistive memory cells, and
   the second resistance corresponds to a low resistance state of the plurality of reference resistive memory cells.

3. The neuromorphic computing device of claim 2, wherein the resistance of the at least one offset resistor is obtained based on Equation 1 as follows:

$$Roffset = \frac{2RhRl}{Rh - Rl} \quad \text{[Equation 1]}$$

in Equation 1, Roffset denotes the resistance of the at least one offset resistor, Rh denotes the first resistance, and Rl denotes the second resistance.

4. The neuromorphic computing device of claim 1, wherein a resistance of the at least one offset resistor is obtained by performing a simulation based on a plurality of sample resistances associated with the at least one reference current.

5. The neuromorphic computing device of claim 4, wherein the resistance of the at least one offset resistor is determined based on a median value of the plurality of sample resistances.

6. The neuromorphic computing device of claim 4, wherein the resistance of the at least one offset resistor is obtained based on Equation 2 and Equation 3 as follows:

$$Roffset = Vread * \frac{a+b}{a*b} \quad \text{[Equation 2]}$$

$$a = I\min(mac+1) - I\max(mac) @ T, \quad \text{[Equation 3]}$$

$$t, col \text{ of shift max}$$

$$b = I\min(mac+1) - I\max(mac) @ T,$$

$$t, col \text{ of shift min}$$

in Equation 2 and Equation 3, Roffset denotes the resistance of the at least one offset resistor, Vread denotes a read voltage, Imax(mac) denotes a maximum value of a first current level of the plurality of read currents sensed by the at least one reference current, and Imin (mac+1) denotes a minimum value of a second current level of the plurality of read currents sensed by the at least one reference current.

7. The neuromorphic computing device of claim 1, wherein:
the at least one reference bitline includes a first reference bitline and a second reference bitline,
the at least one reference source line includes a first reference source line and a second reference source line, and
the at least one offset resistor includes a first offset resistor connected between the first reference bitline and the first reference source line, and a second offset resistor connected between the second reference bitline and the second reference source line.

8. The neuromorphic computing device of claim 7, wherein a resistance of the first offset resistor and a resistance of the second offset resistor are equal to each other.

9. The neuromorphic computing device of claim 1, wherein a number of the at least one offset resistor is equal to a number of the at least one reference bitline and a number of the at least one reference source line.

10. The neuromorphic computing device of claim 1, further comprising:
a wordline driver configured to drive a plurality of wordlines connected to the first memory cell array, configured to drive a plurality of reference wordlines connected to the second memory cell array, and configured to drive the plurality of reference wordlines such that all of the plurality of reference wordlines are enabled during a computational operation of the neuromorphic computing device.

11. The neuromorphic computing device of claim 10, wherein a number of the at least one reference bitline is equal to the number of the plurality of wordlines.

12. The neuromorphic computing device of claim 10, wherein:
the plurality of data stored in the plurality of resistive memory cells correspond to a plurality of elements of a weight matrix used in the computational operation of the neuromorphic computing device, and
the wordline driver is configured to drive the plurality of wordlines such that at least one wordline among the plurality of wordlines is enabled based on element values of an input feature vector during the computational operation of the neuromorphic computing device.

13. The neuromorphic computing device of claim 1, wherein the plurality of reference resistive memory cells include a resistive material that is the same material as a resistive material included in the plurality of resistive memory cells.

14. The neuromorphic computing device of claim 1, wherein the analog-to-digital converting circuit includes:
a plurality of analog-to-digital converters configured to convert the plurality of read currents into the plurality of digital signals.

15. The neuromorphic computing device of claim 14, wherein each of the plurality of analog-to-digital converters is configured to generate a respective one of the plurality of digital signals by comparing a respective one of the plurality of read currents with the at least one reference current.

16. The neuromorphic computing device of claim 15, wherein each of the plurality of analog-to-digital converters includes:
a comparing circuit configured to generate at least one comparison signal by comparing a respective one of the plurality of read currents with the at least one reference current; and
an encoding circuit configured to generate a respective one of the plurality of digital signals based on the at least one comparison signal.

17. The neuromorphic computing device of claim 1, further comprising:
a multiplexing circuit configured to output selected read currents from among the plurality of read currents,
wherein the analog-to-digital converting circuit includes analog-to-digital converters configured to convert the selected read currents into digital signals, and a number of the analog-to-digital converters is less than a number of the plurality of read currents.

18. The neuromorphic computing device of claim 1, further comprising:
an adder circuit configured to generate output data by performing accumulation and summation operations based on the plurality of digital signals.

19. A method of designing a neuromorphic computing device, the method comprising:
designing structures of a first memory cell array, a second memory cell array and an analog-to-digital converting circuit included in the neuromorphic computing device; and
determining a resistance of at least one offset resistor included in the second memory cell array, wherein the first memory cell array includes a plurality of resistive memory cells, is configured to store a plurality of data, is configured to generate a plurality of read currents based on a plurality of input signals and the plurality of data, and is configured to output the plurality of read currents through a plurality of bitlines or a plurality of source lines, wherein the second memory cell array includes a plurality of reference resistive memory cells and the at least one offset resistor, and is configured to output at least one reference current through at least one reference bitline or at least one reference source line, wherein the analog-to-digital converting circuit is configured to convert the plurality of read currents into a plurality of digital signals based on the at least one reference current, and wherein the at least one offset resistor is connected between the at least one reference bitline and the at least one reference source line.

20. A neuromorphic computing device comprising:

a first memory cell array including a plurality of resistive memory cells that are connected to a plurality of wordlines, a plurality of bitlines and a plurality of source lines;

a second memory cell array including a plurality of reference resistive memory cells and a plurality of offset resistors, the plurality of reference resistive memory cells being connected to a plurality of reference wordlines, a plurality of reference bitlines and a plurality of reference source lines;

a wordline driver configured to drive the plurality of wordlines such that such that at least one wordline among the plurality of wordlines is enabled based on element values of an input feature vector, and configured to drive the plurality of reference wordlines such that all of the plurality of reference wordlines are enabled;

an analog-to-digital converting circuit configured to convert a plurality of read currents into a plurality of digital signals based on a plurality of reference currents, the plurality of read currents being output from the first memory cell array through the plurality of bitlines or the plurality of source lines, the plurality of reference currents being output from the second memory cell array through the plurality of reference bitlines or the plurality of reference source lines; and an adder circuit configured to generate output data by performing accumulation and summation operations based on the plurality of digital signals, wherein each of the plurality of offset resistors is connected between a respective one of the plurality of reference bitlines and a respective one of the plurality of reference source lines, wherein all of the plurality of offset resistors have the same resistance, wherein the resistances of the plurality of offset resistors are determined based on a first resistance and a second resistance, or is obtained by performing a simulation based on a plurality of sample resistances associated with the plurality of reference currents, and wherein the first resistance corresponds to a high resistance state of the plurality of reference resistive memory cells, and the second resistance corresponds to a low resistance state of the plurality of reference resistive memory cells.

* * * * *